US008877291B2

(12) United States Patent
Honda et al.

(10) Patent No.: US 8,877,291 B2
(45) Date of Patent: Nov. 4, 2014

(54) METHOD OF MANUFACTURING THIN FILM WHICH SUPPRESSES UNNECESSARY SCATTERING AND DEPOSITION OF A SOURCE MATERIAL

(75) Inventors: Kazuyoshi Honda, Osaka (JP); Kunihiko Bessho, Osaka (JP); Takashi Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 263 days.

(21) Appl. No.: 13/390,633

(22) PCT Filed: Jun. 1, 2011

(86) PCT No.: PCT/JP2011/003084
§ 371 (c)(1),
(2), (4) Date: Feb. 15, 2012

(87) PCT Pub. No.: WO2011/158453
PCT Pub. Date: Dec. 22, 2011

(65) Prior Publication Data
US 2012/0141677 A1 Jun. 7, 2012

(30) Foreign Application Priority Data

Jun. 16, 2010 (JP) ................................. 2010-137224

(51) Int. Cl.
*C23C 16/00* (2006.01)
*C23C 14/56* (2006.01)
*C23C 14/24* (2006.01)
*C23C 14/54* (2006.01)

(52) U.S. Cl.
CPC ............. *C23C 14/562* (2013.01); *C23C 14/243* (2013.01); *C23C 14/54* (2013.01); *C23C 14/24* (2013.01)
USPC ...................................... 427/255.28; 118/727

(58) Field of Classification Search
CPC ........ C23C 14/00; C23C 14/22; C23C 14/24; C23C 14/542
USPC .............................................. 427/248.1, 593
See application file for complete search history.

(56) References Cited

U.S. PATENT DOCUMENTS 5,803,976 A * 9/1998 Baxter et al. .................. 118/726
6,080,679 A 6/2000 Suzuki (Continued)

FOREIGN PATENT DOCUMENTS

EP 0652302 A1 5/1995
JP 61-240436 10/1986

(Continued)

OTHER PUBLICATIONS

Lowe, John. Variation of Vapor Pressure with Temperature. Jun. 1990. Retrieved Jan. 10, 2014 from courses.chem.psu.edu/chem12h/vapor.pdf.*

(Continued)

*Primary Examiner* — David Turocy
(74) *Attorney, Agent, or Firm* — McDermott Will & Emery LLP

(57) ABSTRACT

The present invention provides a thin film manufacturing method which realizes stable, highly-efficient film formation using a nozzle-type evaporation source while avoiding unnecessary scattering and deposition of a film formation material before the start of the film formation. Used is a film forming apparatus including: an evaporation chamber 16; a film forming chamber 17 in which a substrate 21 is provided; an evaporation source 19 holding a film formation material 15 and including an opening surface 14; a moving mechanism 35 configured to cause the evaporation source 19 to move; and a conductance variable structure 34. The film forming chamber 17 and the evaporation chamber 16 are evacuated. In a state where the differential pressure between these chambers can be secured by the conductance variable structure 34, the nonreactive gas is introduced to the evaporation chamber 16 to adjust the pressure in the evaporation chamber 16 to predetermined pressure or more. Thus, the evaporation of the film formation material is suppressed. In the same state as above, the nonreactive gas is introduced to the film forming chamber 17 to adjust the pressure in the film forming chamber 17 to the predetermined pressure or more. The conductance variable structure 34 is activated to cancel the above state. Then, the evaporation source 19 is moved by the moving mechanism 35, so that the opening surface 14 is located close to the substrate 21. The pressure in each chamber is decreased to less than the predetermined pressure. Thus, the suppression of the evaporation of the film formation material is canceled, and the film formation is started.

7 Claims, 20 Drawing Sheets

(56) References Cited

U.S. PATENT DOCUMENTS

| | | | |
|---|---|---|---|
| 6,101,316 A * | 8/2000 | Nagashima et al. | 392/388 |
| 6,275,649 B1 | 8/2001 | Nagashima et al. | |
| 6,641,674 B2 * | 11/2003 | Peng | 118/727 |
| 6,946,406 B2 * | 9/2005 | Yamazaki et al. | 438/781 |
| 7,871,667 B2 * | 1/2011 | Awata et al. | 427/248.1 |
| 2002/0132047 A1 | 9/2002 | Yamazaki et al. | |
| 2002/0139305 A1 | 10/2002 | Peng | |

FOREIGN PATENT DOCUMENTS

| | | |
|---|---|---|
| JP | 5-171415 | 7/1993 |
| JP | 09-031633 | 2/1997 |
| JP | 10-158820 | 6/1998 |
| JP | 2009-152189 | 7/2009 |

OTHER PUBLICATIONS

International Search Report issued in International Patent Application No. PCT/JP2011/003084 dated Aug. 30, 2011.

Office Action issued in corresponding U.S. Appl. No. 13/392,433, dated Feb. 6, 2014.

Chinese Office Action issued in Application No. 201180003592.7 dated Mar. 27, 2014.

* cited by examiner

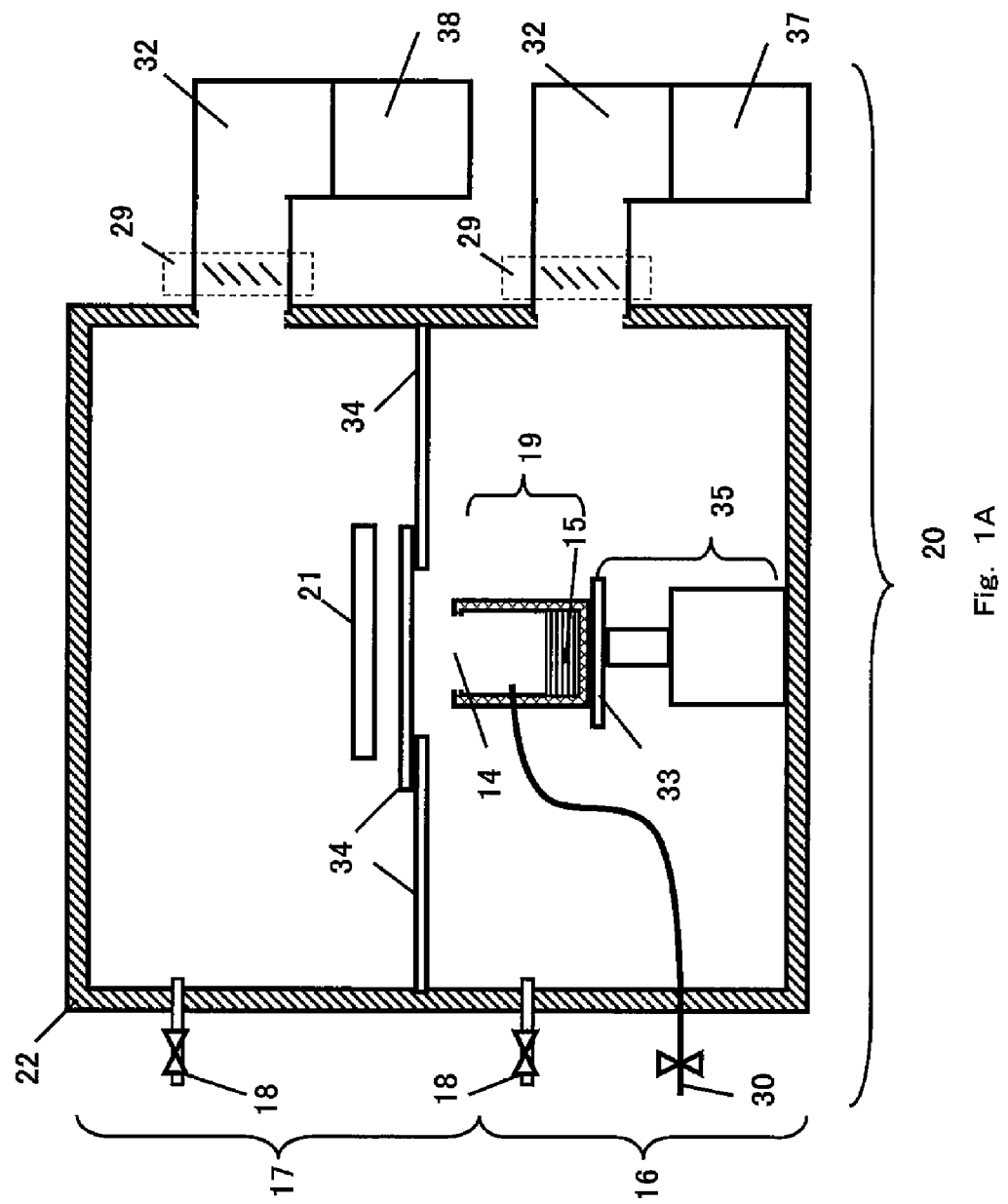

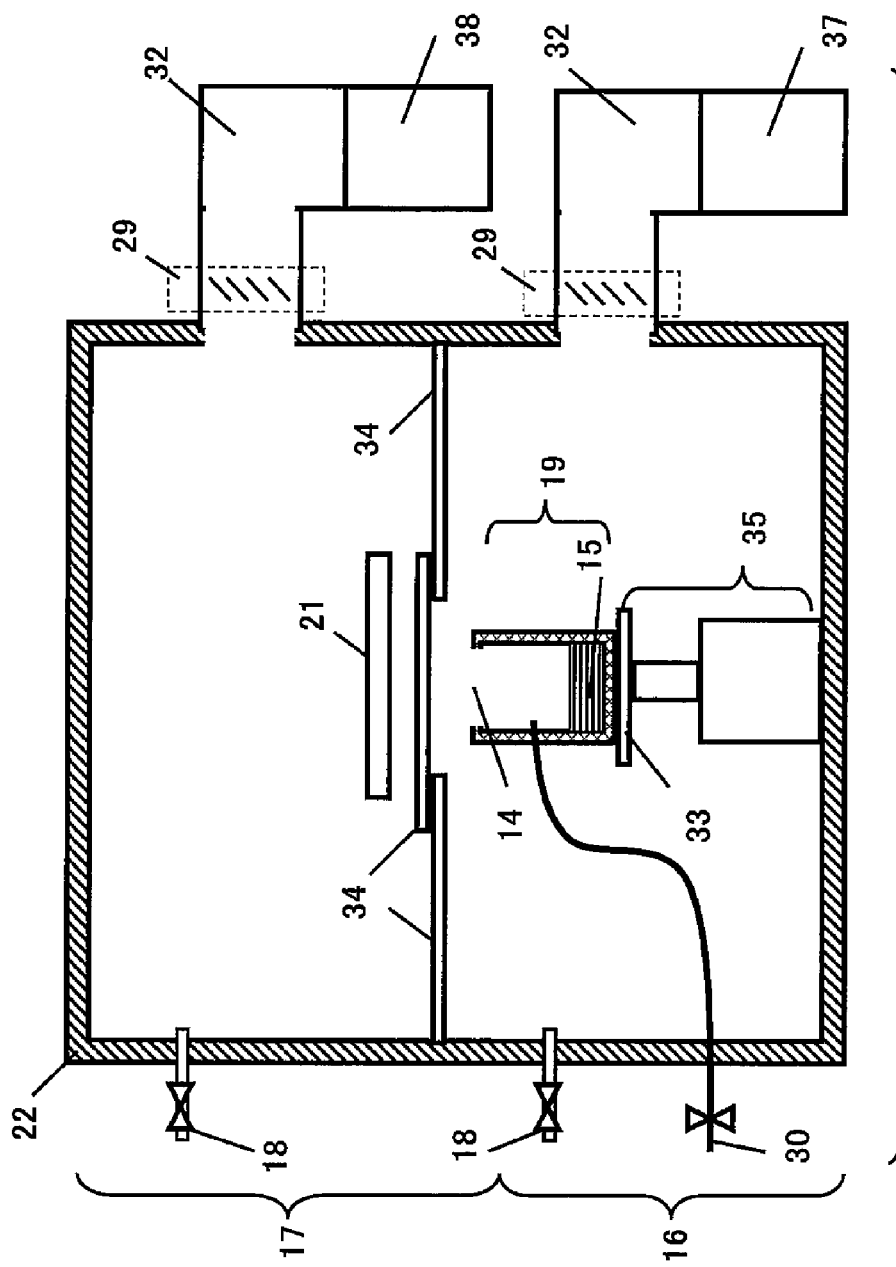

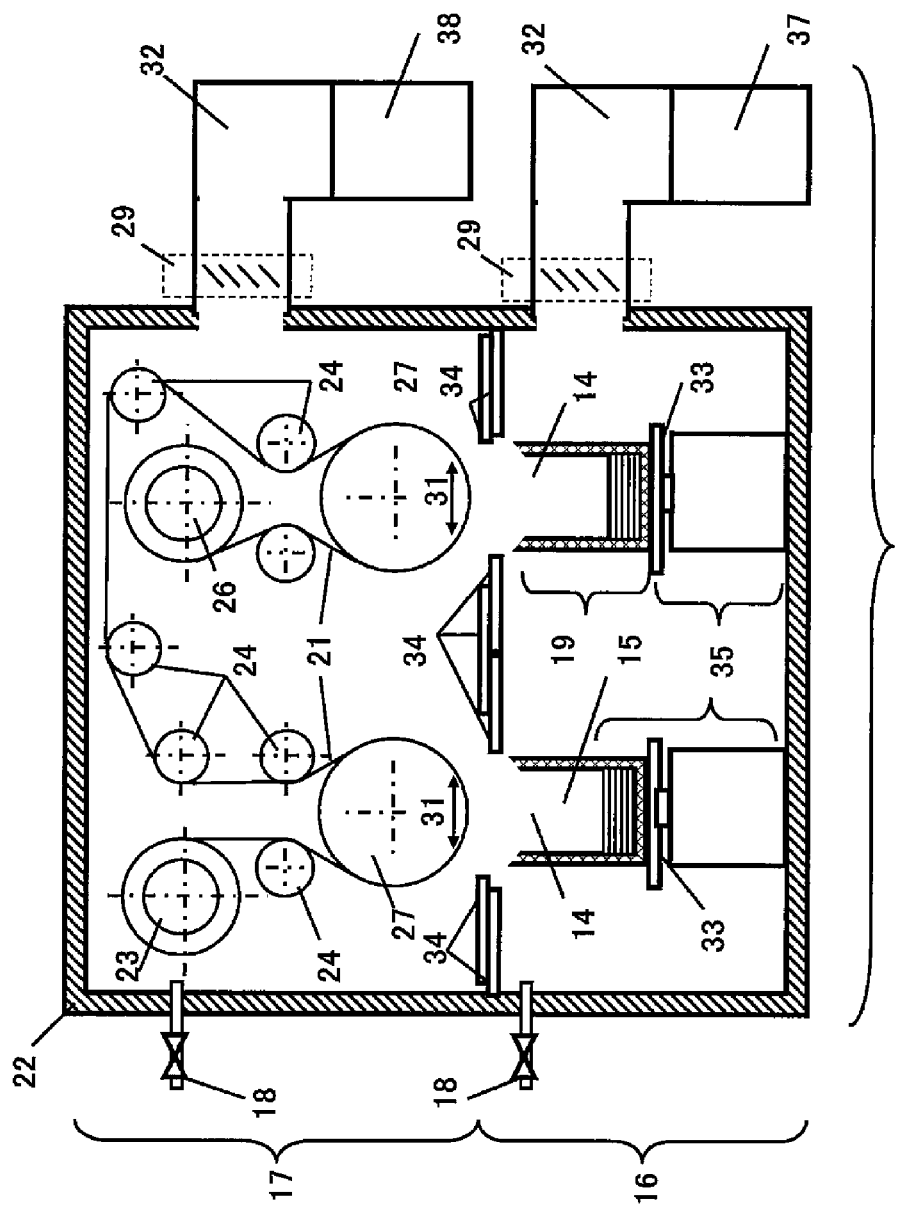

METHOD OF MANUFACTURING THIN FILM WHICH SUPPRESSES UNNECESSARY SCATTERING AND DEPOSITION OF A SOURCE MATERIAL

RELATED APPLICATIONS

This application is the U.S. National Phase under 35 U.S.C. §371 of International Application No. PCT/JP2011/003084, filed on Jun. 1, 2011, which in turn claims the benefit of Japanese Application No. 2010-137224, filed on Jun. 16, 2010, the disclosures of which Applications are incorporated by reference herein.

TECHNICAL FIELD

The present invention relates to a method of manufacturing a thin film.

BACKGROUND ART

A thin film technology has been widely utilized for the purpose of the reduction in device sizes and the increase in device performances. There are various film formation methods used for the manufacture of the thin film. Examples are a deposition method, sputtering, ion plating, CVD, and laser ablation. These methods are used depending on the purpose. The deposition method comparatively excels in productivity. In the deposition method, resistance heating, induction heating, electron beam heating, or the like is used as a method of applying energy for heating and evaporating a film formation material.

One problem of the deposition method is the use efficiency of the film formation material. To be specific, from the standpoint of manufacturing cost, it is important to efficiently precipitate and deposit the evaporated, scattering film formation material on a substrate. To solve this problem, it is effective to use a nozzle-type evaporation source. In the case of using the nozzle-type evaporation source, the film formation material can be emitted from only an opening surface of a nozzle. Therefore, the scattering of the film formation material can be limited. By locating the opening surface and the substrate close to each other, the film formation material can further efficiently adhere to the substrate.

PTL 1 discloses that: in a device configured to form a synthetic resin coating film, open-close devices and evacuating devices are respectively provided for two raw material monomer evaporation source nozzles, and each of inner portions of evaporation source containers is maintained at a constant degree of vacuum regardless of the open or close state of the open-close devices. PTL 1 describes that with the above configuration, the synthetic resin coating films of the same quality are reproducibly, stably formed on the substrates.

PTL 2 discloses that in a method of manufacturing a negative electrode for a nonaqueous electrolyte secondary battery, lithium is supplied by a dry film formation method to a plurality of columnar bodies projecting from the surface of a current collector.

In the deposition method, in a preparatory stage before starting the film formation, the film formation material needs to be adjusted to obtain vapor pressure necessary for the film formation by, for example, heating the film formation material. However, if the film formation material evaporates during the heating, the material loss occurs. Preventing the material loss is important from the standpoint of manufacturing cost.

PTL 3 discloses a method of performing deposition using an organic thin film material. According to PTL 3, in a state where the organic thin film material is accommodated in an evaporation source container, a vacuum pump is activated to evacuate the evaporation source container, the organic thin film material is increased in temperature, and degassing is performed. Then, an inert gas for suppressing the evaporation is introduced to the evaporation source container, and the organic thin film material is further increased in temperature. After the organic thin film material reaches an evaporation temperature in vacuum, the evaporation source container is evacuated by the vacuum pump. Thus, the vapor of the organic thin film material is generated. Then, an evaporation source shutter and substrate shutter provided above an emission opening of the evaporation source container are sequentially opened, and the formation of an organic thin film on the surface of a film formation target object provided in a vacuum chamber is started. According to the method described in PTL 3, since the generation of the vapor of the organic thin film material is suppressed under an inert gas atmosphere, the organic thin film material can be effectively utilized. PTL3 also describes that since the inert gas serves as a heat medium, the temperature increase rate is high, and thermal uniformity is good.

CITATION LIST

Patent Literature

PTL 1: Japanese Laid-Open Patent Application Publication No. 5-171415
PTL 2: Japanese Laid-Open Patent Application Publication No. 2009-152189
PTL 3: Japanese Laid-Open Patent Application Publication No. 10-158820

SUMMARY OF INVENTION

Technical Problem

To improve the use efficiency of the film formation material in the deposition method, it is effective to perform the film formation in a state where the nozzle-type evaporation source is located close to the substrate. However, according to this method, since the distance between the evaporation source and the substrate is extremely short, a movable shielding member (shutter) cannot be provided between the evaporation source and the substrate. In a state where the shielding member is not provided between the evaporation source and the substrate, the film formation material evaporated in the preparatory stage before starting the film formation is unnecessarily deposited on the substrate. This leads to the material loss, and such material loss is problematic from the viewpoint of the use efficiency of the material.

According to the method described in PTL 3, by introducing the inert gas to the evaporation source container, the generation of the vapor of the material is suppressed until the start of the film formation. Therefore, the material loss can be avoided to some extent. According to this method, after the vapor of the material is generated in the evaporation source by stopping the introduction of the inert gas and evacuating the evaporation source, the shutter is opened, and the film formation is started by emitting the vapor of the material to the vacuum chamber. Therefore, the problem is that before opening the shutter, the vapor of the material adheres to the shutter and this leads to the material loss. In addition, when opening the shutter, rapid pressure variation is caused by the pressure difference between the evaporation source and the vacuum chamber, and this causes the temperature change of the film formation material. Therefore, the problem is that the evaporation and scattering of the material cannot be controlled, and the deposition beyond the scope of the assumption occurs.

An object of the present invention is to provide a thin film manufacturing method capable of solving the above problems and realizing stable, highly-efficient film formation using a nozzle-type evaporation source while avoiding unnecessary scattering and deposition of the film formation material in the film formation preparatory stage and at the time of the start of the film formation.

Solution to Problem

In order to solve the above problems, a thin film manufacturing method of the present invention is a method of manufacturing a thin film in a film forming apparatus, the film forming apparatus including: an evaporation chamber; a film forming chamber which is provided adjacent to the evaporation chamber and in which a substrate is provided; vacuum pumps respectively connected to the evaporation chamber and the film forming chamber; a nonreactive gas introduction mechanism connected to one or both of the evaporation chamber and the film forming chamber; an evaporation source provided in the evaporation chamber, holding a film formation material, and having a semi-sealed structure including an opening surface; a moving mechanism configured to cause the evaporation source to move such that the opening surface is able to be located close to the substrate; and a conductance variable structure provided between the evaporation chamber and the film forming chamber, the method including: a first step of evacuating the film forming chamber and the evaporation chamber; after the first step, a second step of suppressing evaporation of the film formation material by introducing a nonreactive gas to the evaporation chamber to adjust pressure in the evaporation chamber to predetermined pressure or more in a state where differential pressure between the evaporation chamber and the film forming chamber is able to be secured by the conductance variable structure; after the first step, a third step of introducing the nonreactive gas to the film forming chamber to adjust the pressure in the film forming chamber to the predetermined pressure or more in a state where the differential pressure between the evaporation chamber and the film forming chamber is able to be secured by the conductance variable structure; after the second step and the third step, a fourth step of activating the conductance variable structure to cancel the state where the differential pressure between the evaporation chamber and the film forming chamber is able to be secured; after the fourth step, a fifth step of causing the evaporation source to move by the moving mechanism such that the opening surface is located close to the substrate; and after the fifth step, a sixth step of canceling suppression of the evaporation of the film formation material and starting film formation on the substrate by decreasing the pressure in each of the film forming chamber and the evaporation chamber to less than the predetermined pressure.

With the above configuration, while suppressing the evaporation and scattering of the film formation material in the film formation preparatory stage, the film formation can be performed in a state where the substrate and the evaporation source are located close to each other.

In the present invention, it is preferable that in the second step, the nonreactive gas be introduced to the evaporation chamber while heating the film formation material in the evaporation source. With this, the film formation material can easily obtain predetermined vapor pressure, that is, vapor pressure suitable for the film formation.

In the present invention, it is preferable that the predetermined pressure be twice or more as high as the vapor pressure of the film formation material. With this, the evaporation of the film formation material can be surely secured.

In the present invention, it is preferable that in the second step, when heating the film formation material in the evaporation source, an amount of the nonreactive gas introduced to the evaporation chamber be increased in accordance with temperature increase of the film formation material. With this, the evaporation of the film formation material can be surely suppressed. In addition, since an unnecessary increase in the amount of nonreactive gas introduced is not performed, excessively high load can be prevented from being applied to the vacuum pump.

It is preferable that the second step and the third step be performed while evacuating the film forming chamber and the evaporation chamber at an evacuating rate lower than an evacuating rate in the first step. With this, while introducing the nonreactive gas, the pressure in each chamber can be easily adjusted to the predetermined pressure or more.

Advantageous Effects of Invention

According to the thin film manufacturing method of the present invention, the film formation can be performed in a state where the substrate and the evaporation source are located close to each other. Therefore, the use efficiency of the film formation material can be improved. In addition, the evaporation and scattering of the film formation material can be suppressed when the film formation material is being increased in temperature in the preparatory stage before the start of the film formation. Therefore, the film formation material can be prevented from being unnecessarily deposited on the substrate and the members in the film forming apparatus, and the loss of the film formation material can be prevented. In addition, the film formation material can be prevented from being evaporated and scattering more than necessary by the rapid pressure variation and the temperature change of the film formation material at the time of the start of the film formation.

BRIEF DESCRIPTION OF DRAWINGS

FIG. 1A is a diagram schematically showing one example of a device (during preparation for film formation) used in a thin film manufacturing method of the present invention.

FIG. 3A is a diagram schematically showing one example of a conductance variable structure (when differential pressure is secured).

FIG. 5(2) is a diagram schematically showing Embodiment 1 (second step) of the thin film manufacturing method of the present invention.

FIG. 5(3) is a diagram schematically showing Embodiment 1 (third step) of the thin film manufacturing method of the present invention.

FIG. 5(4) is a diagram schematically showing Embodiment 1 (fourth step) of the thin film manufacturing method of the present invention.

FIG. 5(5) is a diagram schematically showing Embodiment 1 (fifth step) of the thin film manufacturing method of the present invention.

FIG. 5(6) is a diagram schematically showing Embodiment 1 (sixth step) of the thin film manufacturing method of the present invention.

FIG. 6(2) is a diagram schematically showing Embodiment 2 (second step) of the thin film manufacturing method of the present invention.

FIG. 6(3) is a diagram schematically showing Embodiment 2 (third step) of the thin film manufacturing method of the present invention.

FIG. 6(4) is a diagram schematically showing Embodiment 2 (fourth step) of the thin film manufacturing method of the present invention.

FIG. 6(5) is a diagram schematically showing Embodiment 2 (fifth step) of the thin film manufacturing method of the present invention.

FIG. 6(6) is a diagram schematically showing Embodiment 2 (sixth step) of the thin film manufacturing method of the present invention.

DESCRIPTION OF EMBODIMENTS

Hereinafter, embodiments of the present invention will be explained in reference to the drawings.

Figure 1B:
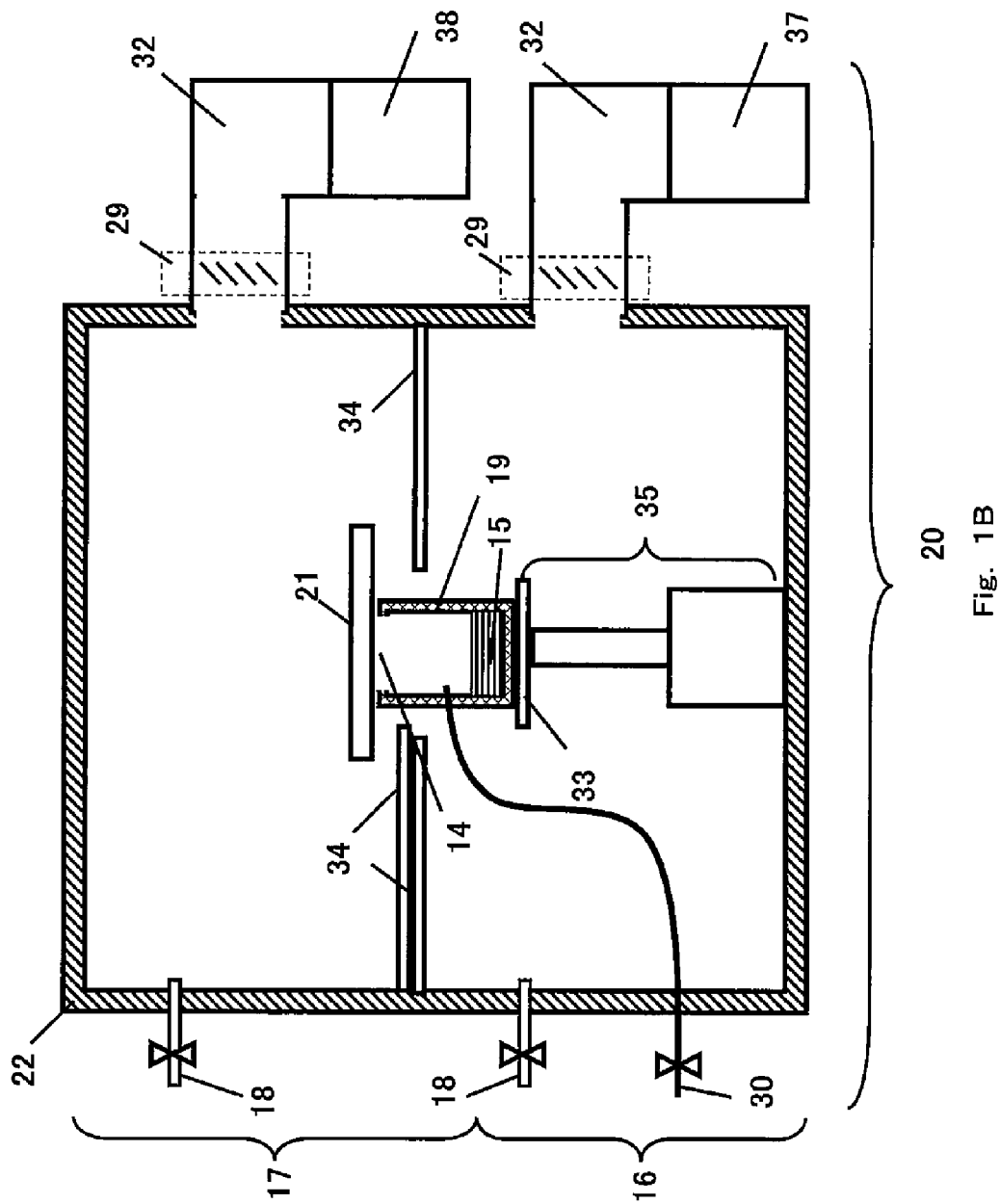
FIG. 1B is a diagram schematically showing one example of the device (during the film formation) used in the thin film manufacturing method of the present invention.

A thin film manufacturing method of the present invention can be performed by using a film forming apparatus schematically shown in FIGS. 1A and 1B and described below. FIG. 1A is a diagram schematically showing the film forming apparatus which is preparing for the film formation. FIG. 1B is a diagram schematically showing the film forming apparatus which is performing the film formation.

A film forming apparatus 20 includes a vacuum chamber 22. During the preparation of the film formation, the vacuum chamber 22 is divided into an evaporation chamber 16 and a film forming chamber 17 provided adjacent to the evaporation chamber 16. An evaporation source 19 is provided in the evaporation chamber 16, and a substrate 21 is provided in the film forming chamber 17. Vacuum pumps 37 and 38 are respectively connected to the evaporation chamber 16 and the film forming chamber 17 to evacuate respective chambers. Nonreactive gas introduction mechanisms 18 are respectively connected to the evaporation chamber 16 and the film forming chamber 17 to introduce a nonreactive gas to respective chambers. The evaporation source 19 is provided in the evaporation chamber 16. The evaporation source 19 holds a film formation material 15, has a semi-sealed structure including an opening surface 14, and is heatable. The substrate 21 that is a film formation target object is provided in the film forming chamber 17. The evaporation source 19 is provided so as to be movable by a moving mechanism 35. With this, the opening surface 14 of the evaporation source 19 can be moved close to the substrate 21 as shown in FIG. 1B and can be moved away from the substrate 21 as shown in FIG. 1A. A conductance variable structure 34 is provided between the evaporation chamber 16 and the film forming chamber 17. The evaporation chamber 16 and the film forming chamber 17 are divided by this conductance variable structure 34. By moving the conductance variable structure 34, spatial continuity between the film forming chamber 16 and the evaporation chamber 17 is completely or substantially shut off, so that differential pressure between these chambers is secured, or the spatial continuity between these chambers is kept, so that the pressure is the same between these chambers.

The vacuum chamber 22 constituting the evaporation chamber and the film forming chamber is a pressure-resistant metal container. The vacuum pumps 37 and 38 are connected to the vacuum chamber 22 via vacuum valves (not shown). Various vacuum pumps can be used as the vacuum pumps 37 and 38. Generally, each of the vacuum pumps 37 and 38 is constituted by a main pump and an auxiliary pump, such as an oil-sealed rotary pump. An oil diffusion pump, a cryopump, or a turbo-molecular pump is preferably used as the main pump. It is desirable to provide main valves 32 each configured to open and close the main pump. It is also desirable that conductance valves 29 each configured to adjust an evacuating rate be respectively provided between the main pump and the evaporation chamber and between the main pump and the film forming chamber.

The nonreactive gas introduction mechanisms 18 are respectively connected to the evaporation chamber 16 and the film forming chamber 17 and introduce the nonreactive gas to respective chambers. In FIG. 1, the nonreactive gas introduction mechanisms 18 are respectively connected to the evaporation chamber 16 and the film forming chamber 17. However, the present invention is not limited to this. The nonreactive gas introduction mechanism 18 may be connected to only one of the evaporation chamber 16 and the film forming chamber 17. For example, the nonreactive gas introduction mechanism 18 is constituted by: a gas source (not shown), such as a gas bomb; a flow rate controller (not shown) connected to the gas source through a pipe; a pipe extending between a vacuum chamber and the flow rate controller; and a gas valve configured to select gas introduction or gas shut-off. A mass flow controller or the like is used as the flow rate controller.

Figure 6:
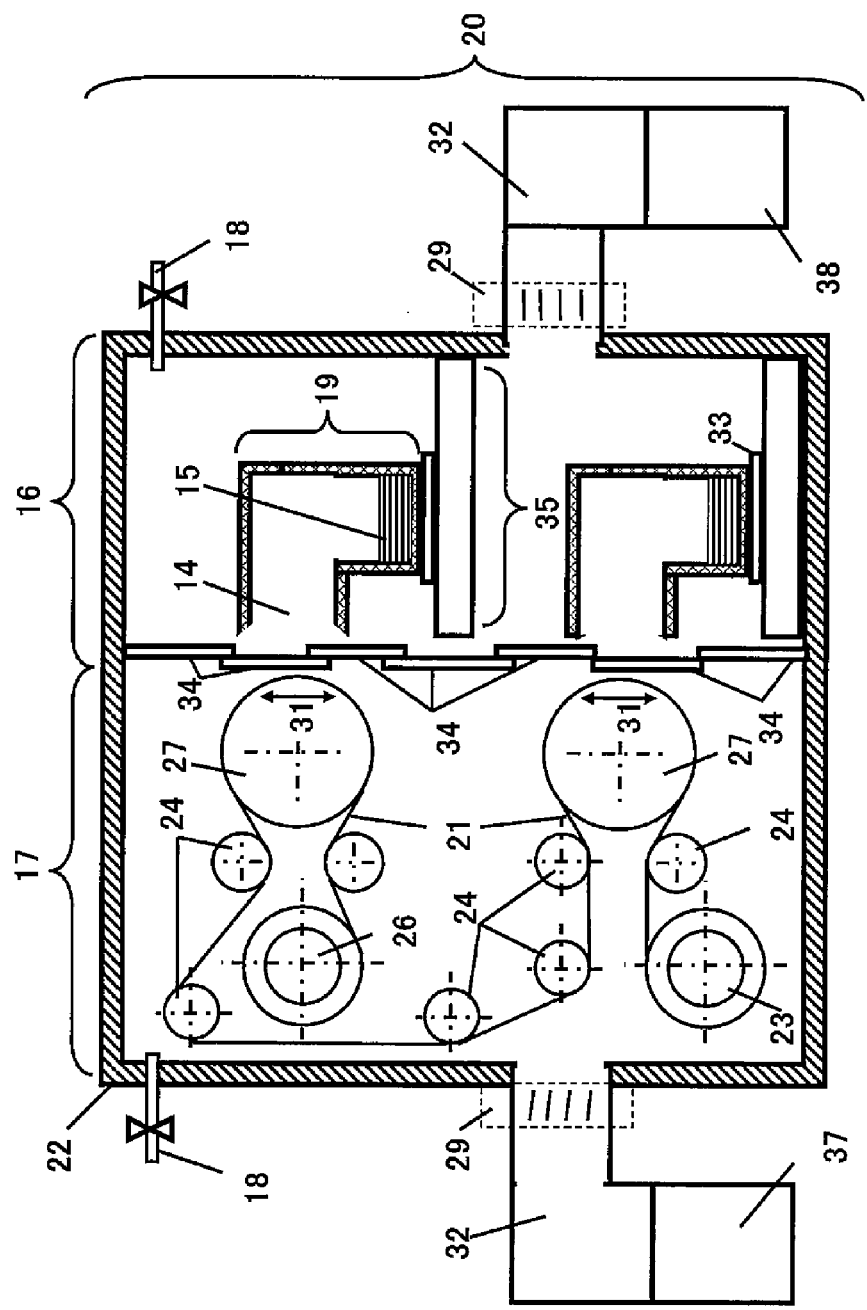
FIG. 6(1) is a diagram schematically showing Embodiment 2 (first step) of the thin film manufacturing method of the present invention.
Figure 6:
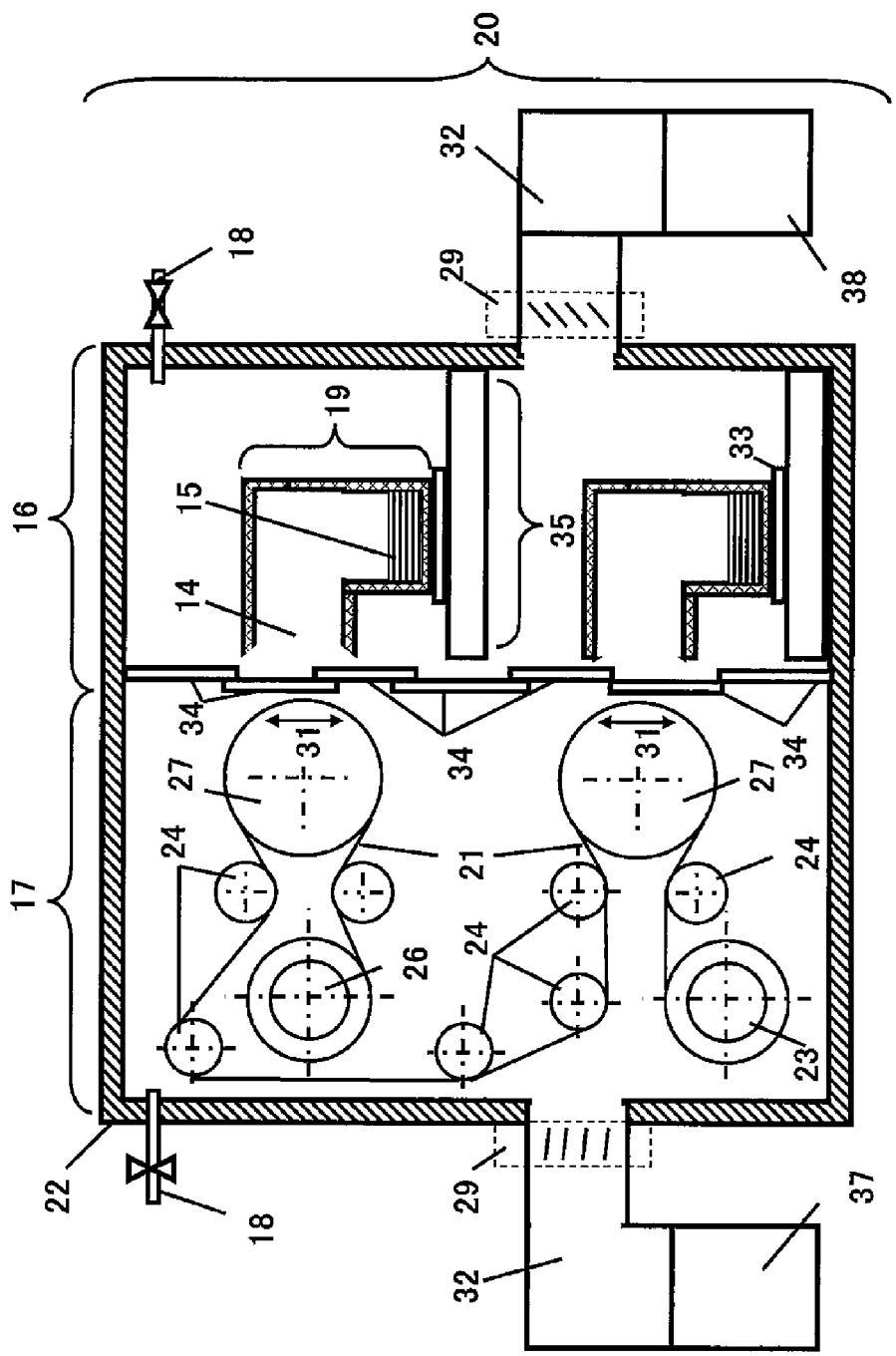
Figure 6:
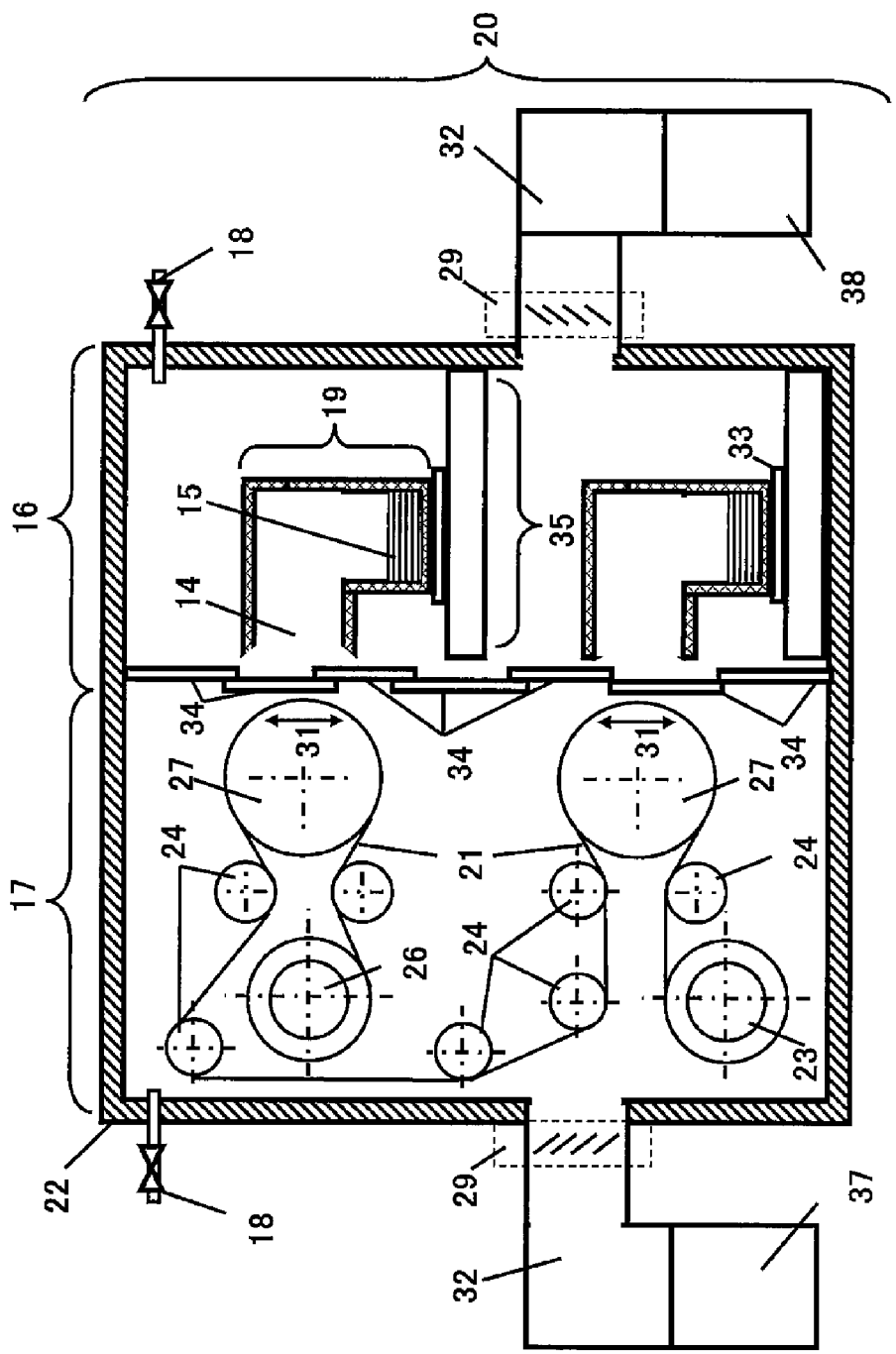
Figure 6:
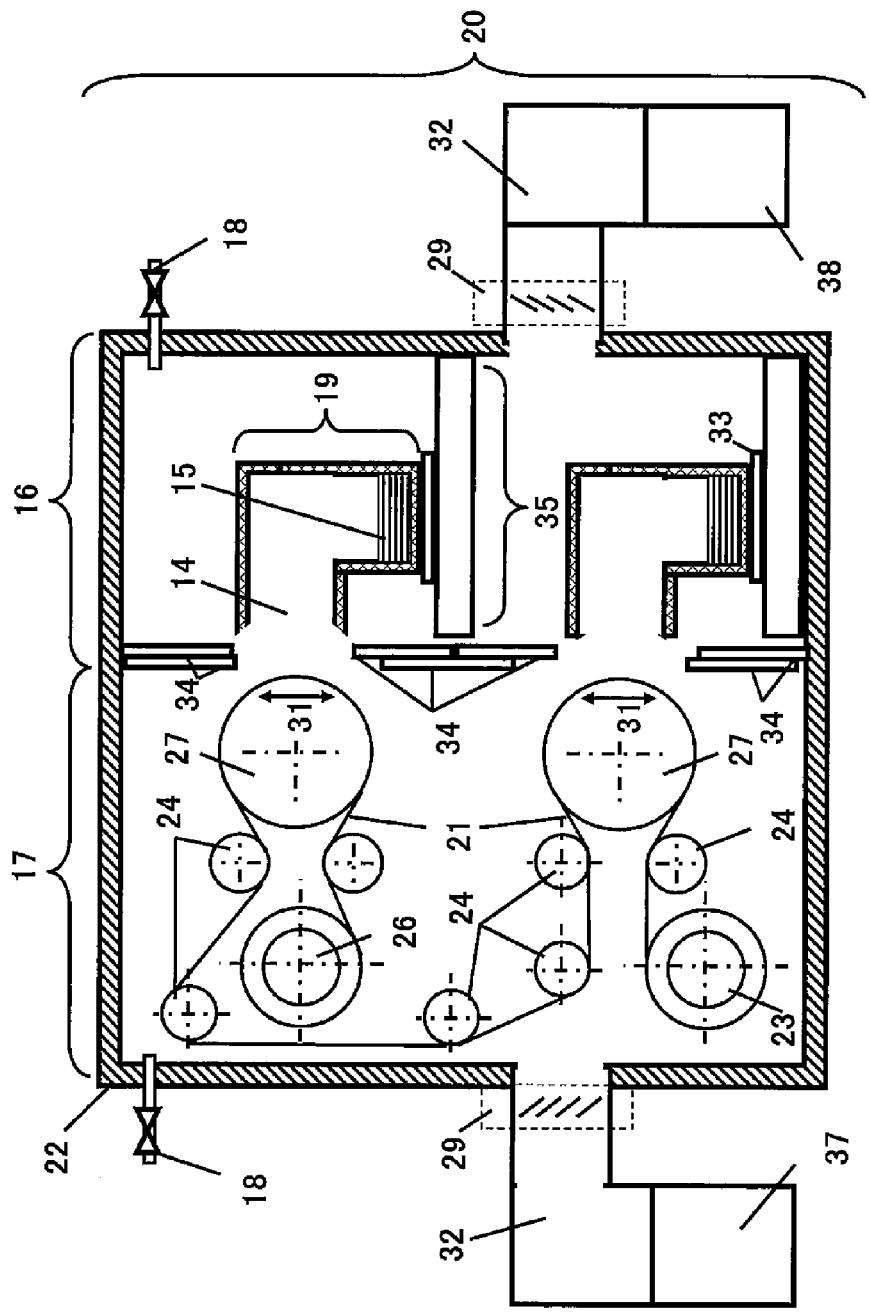
Figure 6:
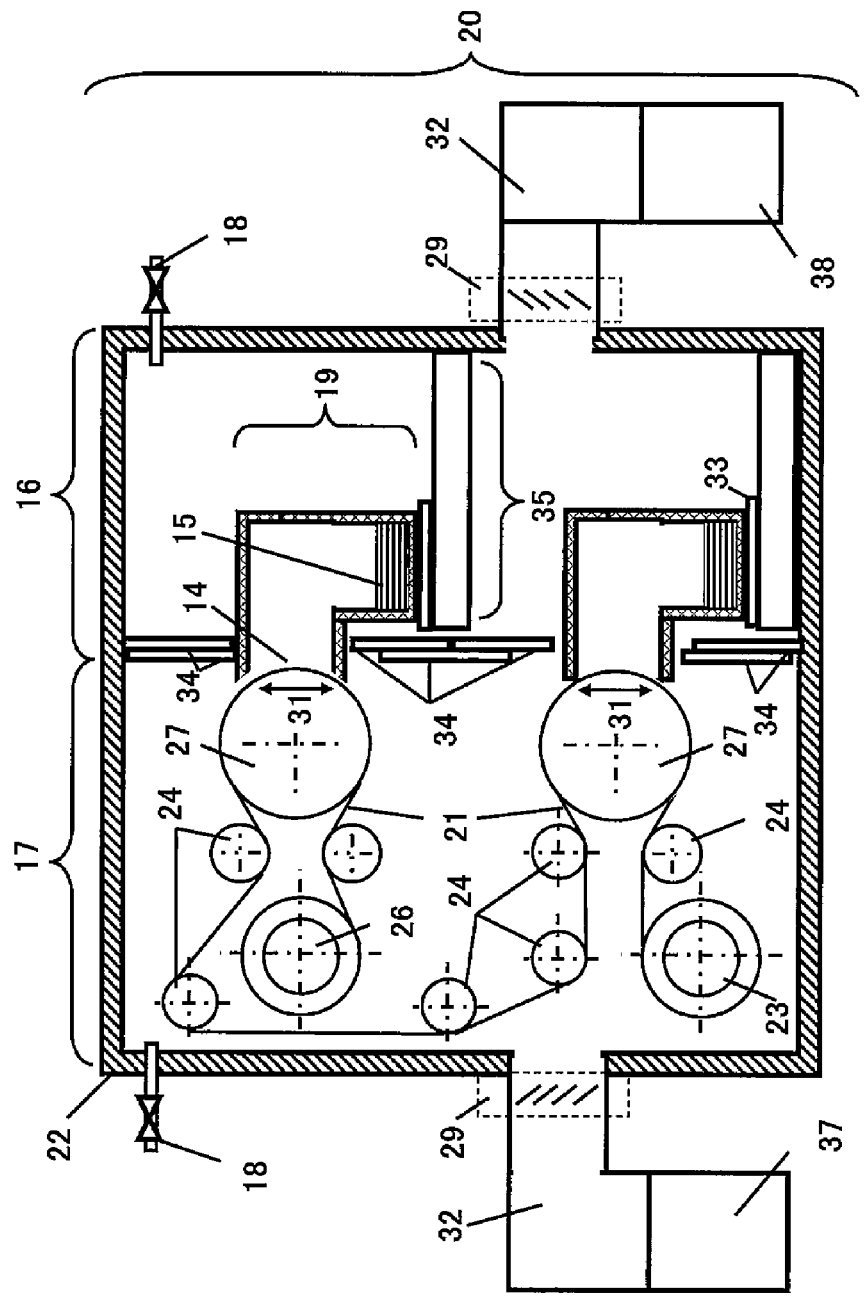
Figure 6:
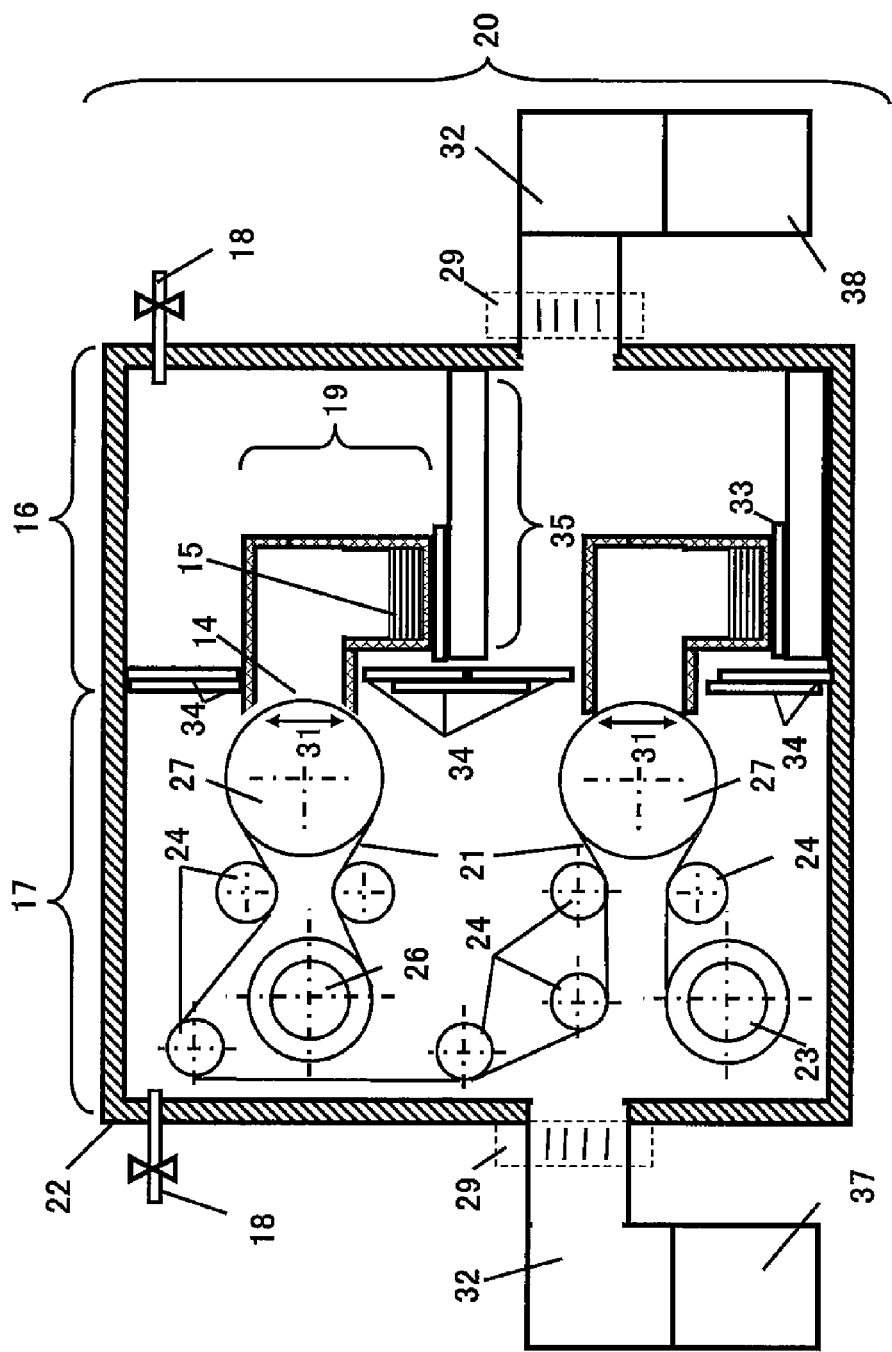

The evaporation source 19 having the semi-sealed structure accommodates the film formation material 15 and has the opening surface 14 which allows the evaporation and scattering of the evaporated material. For example, the shape of the evaporation source may be a columnar shape having an opening on its upper surface or a rectangular solid shape having an opening on its upper surface. By locating the opening, formed on an upper portion of the evaporation source, close to the substrate, the vapor of the film formation material does not scatter to the environment and is deposited only on the substrate 21. Therefore, the film formation material can be efficiently utilized. However, the opening does not have to face upward. For example, as shown in FIGS. 6(1) to 6(5), the evaporation source having the opening on its side surface can also be used. In this case, the substrate is provided vertically. For example, a metal material, a carbon material, or a refractory material, which is low-reactive with the film formation material, is used as a material constituting the evaporation source. According to need, the evaporation source may be constituted by the combination of these materials. As shown in FIG. 1A, the entire evaporation source 19 is located in the evaporation chamber 16 in a film formation preparatory stage. However, as shown in FIG. 1B, during the film formation, at least the opening surface 14 of the evaporation source 19 projects into the film forming chamber 17 to be located close to the substrate 21.

As shown in FIG. 1, the moving mechanism 35 is a lifting mechanism including a stage 33 on which, for example, the evaporation source 19 is mounted. The lifting mechanism can be constituted by, for example, an oil-pressure cylinder, a ball screw, and a gear. By moving up or down the stage by the lifting mechanism, the opening surface 14 formed at the upper portion of the evaporation source 19 can be moved close to or away from the substrate provided above the evaporation source. However, the moving mechanism is not limited to this. For example, the moving mechanism may be configured so as to cause the evaporation source, including the opening on its side surface, to move in a horizontal direction, or the moving mechanism may be configured so as to cause the opening to move close to or away from the substrate by the combination of a vertical or horizontal straight movement and a rotational movement.

Figure 3B:
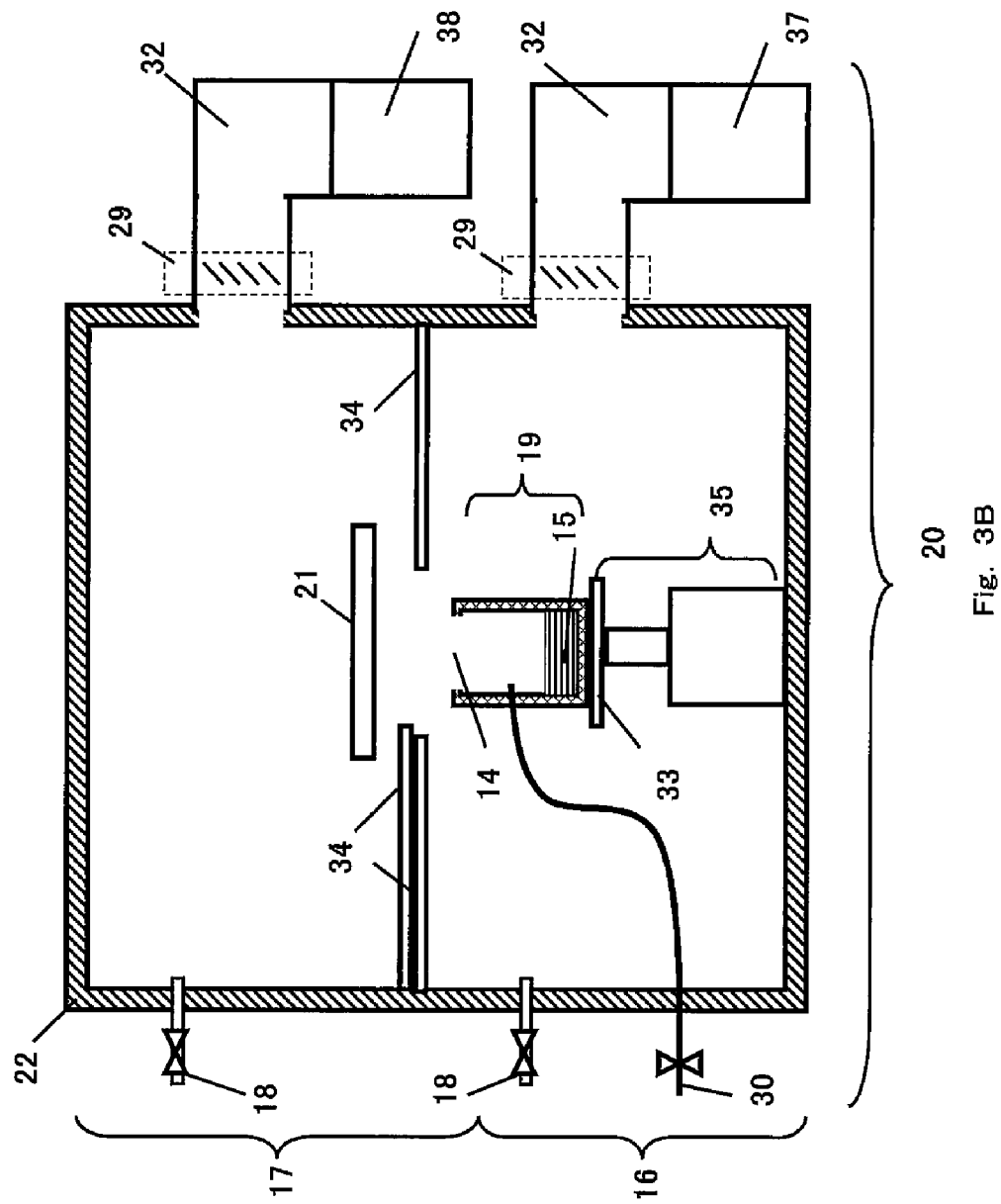
FIG. 3B is a diagram schematically showing one example of the conductance variable structure (when the differential pressure is canceled).
Figure 4A:
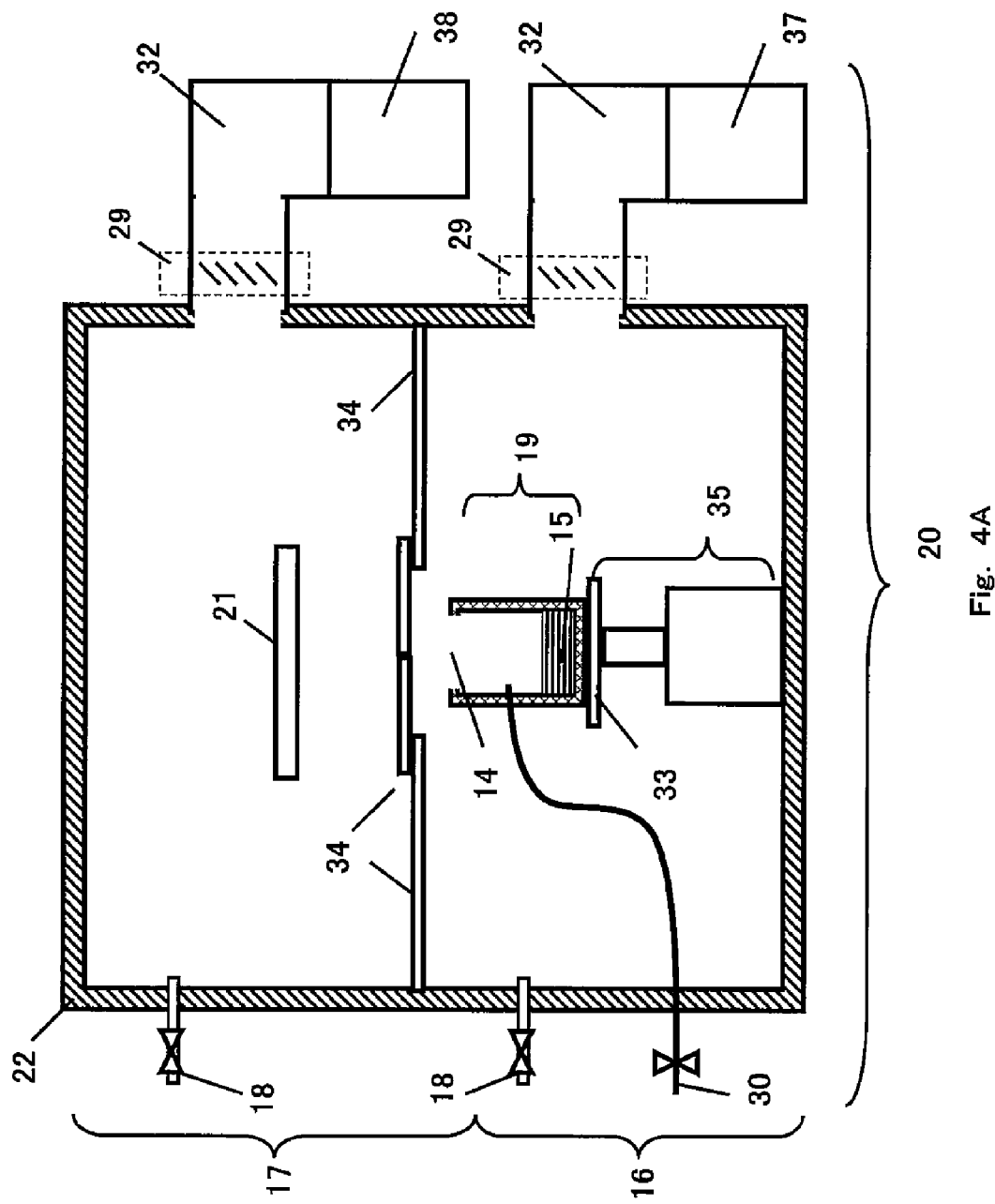
FIG. 4A is a diagram schematically showing another example of the conductance variable structure (when the differential pressure is secured).
Figure 4B:
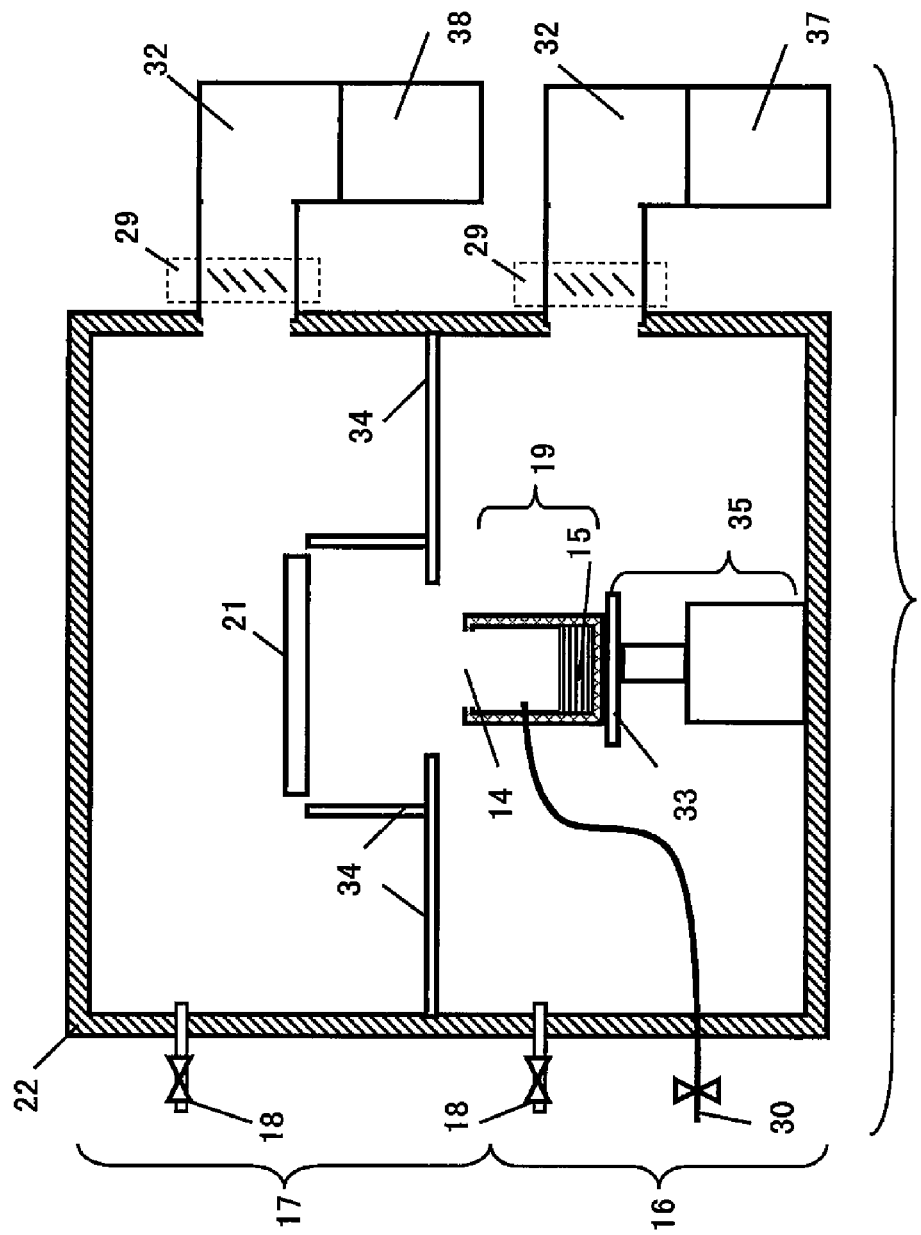
FIG. 4B is a diagram schematically showing another example of the conductance variable structure (when the differential pressure is canceled).

The conductance variable structure 34 is provided at a boundary between the evaporation chamber 16 and the film forming chamber 17. By activating the conductance variable structure 34, the differential pressure can be secured between the evaporation chamber 16 and the film forming chamber 17, or the pressure can be equalized between these chambers. The conductance variable structure is, for example, a plate-shaped movable dividing wall. By completely or substantially shutting off a communication passage between the evaporation chamber 16 and the film forming chamber 17, a communication state between the evaporation chamber and the film forming chamber can be shut off, and the differential pressure between these chambers can be secured. In addition, by partially or entirely moving the movable dividing wall to form the communication passage between the evaporation chamber and the film forming chamber, the communication state between these chambers can be enlarged, and the pressure can be substantially equalized between these chambers. FIGS. 3A, 3B, 4A, and 4B schematically show operation examples of the conductance variable structure. FIGS. 3A and 3B show a slide type movable dividing wall, and FIGS. 4A and 4B show a double-door type movable dividing wall. Each of FIGS. 3A and 4A shows a state where the communication passage is shut off and the differential pressure is secured (differential pressure structure). Each of FIGS. 3B and 4B shows a state where the communication passage is formed and the differential pressure structure is canceled. In a case where a small amount of vapor is generated during the heating of the evaporation source, the prevention of the deposition can be performed by a member constituting the conductance variable structure. However, a shutter mechanism for the mild prevention of deposition may be additionally provided between the conductance variable structure and the evaporation source.

In a state where the conductance variable structure forms the communication passage (FIGS. 3B and 4B), the opening surface 14 of the evaporation source 19 is provided under the communication passage, and the substrate 21 is provided above the communication passage. By moving up the evaporation source 19 by the moving mechanism 35 to cause the opening surface 14 to pass through the communication passage, the opening surface 14 can be located close to the substrate 21. Therefore, it is preferable that the size of the communication passage formed by opening the conductance variable structure be such that the opening surface 14 of the evaporation source 19 can pass through the communication passage.

According to the thin film manufacturing method of the present invention, the thin film is manufactured in the film forming apparatus descried above. The thin film manufacturing method of the present invention includes steps (a) to (f) below;

(a) a first step of evacuating the film forming chamber and the evaporation chamber;

(b) after the first step, a second step of suppressing evaporation of the film formation material by introducing a nonreactive gas to the evaporation chamber to adjust pressure in the evaporation chamber to predetermined pressure or more in a state where differential pressure between the evaporation chamber and the film forming chamber is able to be secured by the conductance variable structure;

(c) after the first step, a third step of introducing the non-reactive gas to the film forming chamber to adjust the pressure in the film forming chamber to the predetermined pressure or more in a state where the differential pressure between the evaporation chamber and the film forming chamber is able to be secured by the conductance variable structure;

(d) after the second step and the third step, a fourth step of activating the conductance variable structure to cancel the state where the differential pressure between the evaporation chamber and the film forming chamber is able to be secured;

(e) after the fourth step, a fifth step of causing the evaporation source to move by the moving mechanism such that the opening surface is located close to the substrate; and (f) after the fifth step, a sixth step of canceling suppression of the evaporation of the film formation material and starting film formation on the substrate by decreasing the pressure in each of the film forming chamber and the evaporation chamber to less than the predetermined pressure.

Figure 7:
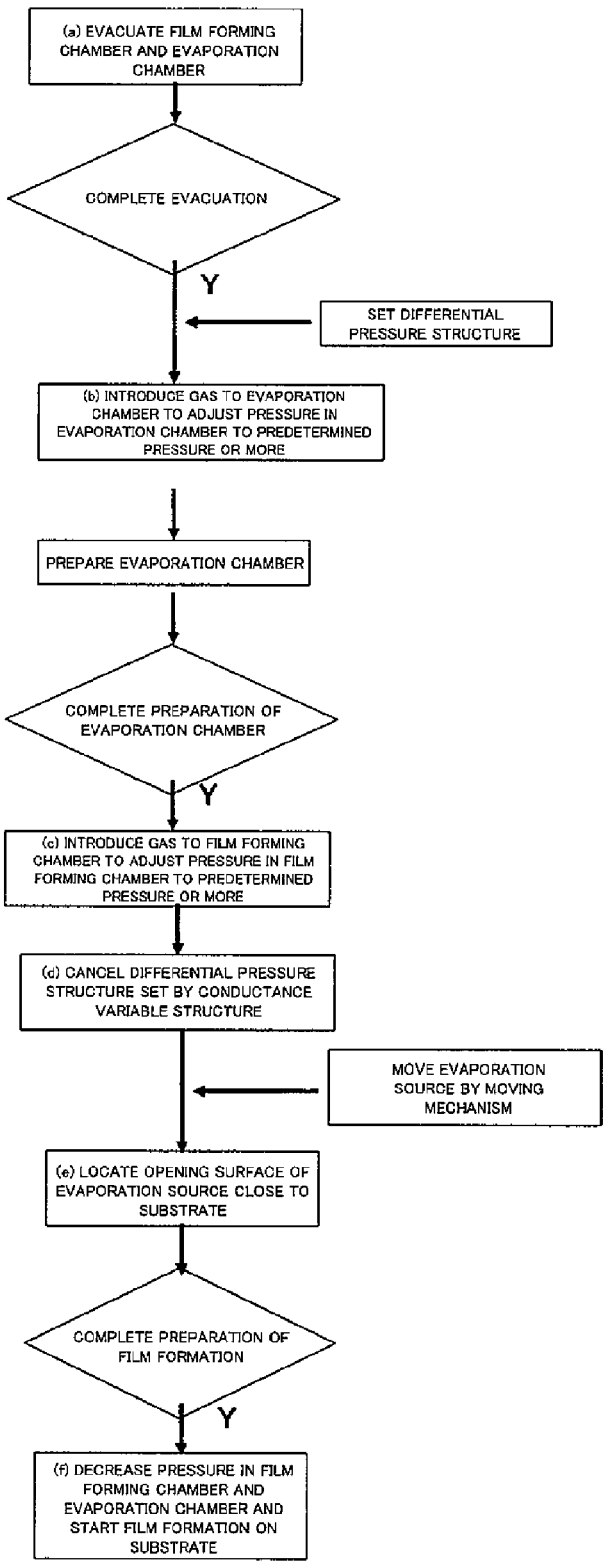
FIG. 7 is a flow chart for explaining the thin film manufacturing method of the present invention.

FIG. 7 shows a flow chart of the thin film manufacturing method of the present invention.

In the step (a) that is the first step, after the substrate and the film formation material are provided at predetermined positions in the film forming apparatus, the evaporation chamber and the film forming chamber are evacuated. In this step, it is desirable that the evaporation chamber and the film forming chamber be evacuated up to high vacuum necessary for the deposition. By evacuating these chambers up to the high vacuum in the first step, an adsorption gas and the like adhering to the members, such as an inner wall of the vacuum chamber, can be removed. Therefore, when evacuating these chambers up to the high vacuum suitable for the film formation in the sixth step, such high vacuum can be achieved quickly. The degree of the high vacuum differs depending on the film formation material and the required film quality, but is, for example, 0.01 Pa or less, and desirably 0.001 Pa or less. In the first step, the state where the differential pressure between the film forming chamber and the evaporation chamber can be secured by shutting off the communication passage by the conductance variable structure 34 may be realized, or the state where the communication between these chambers is secured may be realized. In the first step, the film formation material does not have predetermined vapor pressure.

In the step (b) that is the second step after the first step, the state where the differential pressure between the evaporation chamber and the film forming chamber can be secured is realized by completely or substantially shutting off the communication passage between the evaporation chamber and the film forming chamber (FIG. 1A).

The evaporation source 19 provided in the evaporation chamber 16 holds, for example, the solid film formation material 15. The film formation material melts by heating in the second step and thus obtains significant vapor pressure (vapor pressure suitable for the film formation). As a method of heating the film formation material, it is preferable to use, for example, resistance heating or induction heating. In the case of the resistance heating, the evaporation source can be heated by, for example, winding a heater wire around the evaporation source. The evaporation source can be heated in such a manner that an outlet for a rod-shaped heater is formed on a wall surface of the evaporation source, and the rod-shaped heater is used. In the case of the induction heating, the evaporation source is heated by winding a coil around the evaporation source and applying high-frequency electric power to the coil.

To suppress the evaporation of the film formation material against the vapor pressure of the film formation material, the vapor pressure being generated by heating the film formation material, the nonreactive gas is introduced to the evaporation chamber 16 in a state where the differential pressure can be secured. By the introduction of the nonreactive gas, the pressure in the evaporation chamber is adjusted to predetermined pressure or more. Here, adjusting the pressure to the predetermined pressure or more is preferably adjusting the pressure to pressure higher than the vapor pressure of the film formation material and more preferably adjusting the pressure to pressure that is equal to or higher than twice the vapor pressure of the film formation material. In a case where the pressure of the nonreactive gas in the evaporation chamber 16 exceeds the vapor pressure of the film formation material, the evaporation of the film formation material is suppressed. To surely suppress the evaporation of the film formation material, it is preferable that the introduction of the nonreactive gas be performed in parallel with the temperature increase of the film formation material. The type of the nonreactive gas used can be suitably selected for the purpose of avoiding the reaction with the melted film formation material. The nonreactive gas is desirably argon or neon.

A liquid film formation material may be used as the film formation material. In this case, without heating the film formation material, the film formation material may obtain significant vapor pressure by the pressure decrease in the evaporation chamber. Therefore, the heating of the film formation material in the second step does not necessarily have to be performed. However, the liquid film formation material may be suitably heated depending on a desired evaporation rate at the time of the film formation. Even in the case of using the liquid film formation material, the nonreactive gas is introduced to the evaporation chamber 16 against the significant vapor pressure of the film formation material. In any case, in the second step, the evaporation of the film formation material having the significant vapor pressure is suppressed by introducing the nonreactive gas to the evaporation chamber to adjust the pressure in the evaporation chamber to the predetermined pressure or more. With this, it is possible to avoid the material loss, which occurs when the film formation material evaporates and scatters before the start of the film formation to adhere to the members, such as the conductance variable structure.

In a case where the second step is performed before performing the third step explained below, it is preferable that the film forming chamber be being evacuated continuously from the first step in parallel with the introduction of the nonreactive gas to the evaporation chamber in the second step. With this, the high vacuum state is maintained in the film forming chamber, and the adsorption gas on the inner wall is further reduced. This is advantageous in that the evacuation time in the entire process can be shortened, and the film quality can be secured.

In the step (c) that is the third step after the first step, as with the second step, the state where the differential pressure between the evaporation chamber and the film forming chamber can be secured is realized by completely or substantially shutting off the communication passage between the evaporation chamber and the film forming chamber (FIG. 1A). In this state, the nonreactive gas is also introduced to the film forming chamber to adjust the pressure in the film forming chamber to the predetermined pressure or more. If there is a large pressure difference between the film forming chamber and the evaporation chamber, the rapid pressure decrease in the evaporation chamber and the temperature change of the evaporation source occurs when canceling the differential pressure structure in the fourth step before the start of the film formation. This causes the scattering of the film formation material. In the present invention, the pressure in the film forming chamber is adjusted in advance to pressure higher than the vapor pressure of the film formation material. With this, the rapid pressure decrease in the evaporation chamber and the temperature change of the evaporation source can be avoided when canceling the differential pressure structure in the fourth step. Thus, unnecessary scattering of the film formation material is prevented.

In the third step, it is desirable that the pressure in the film forming chamber 17 be adjusted to be substantially equal to or be higher than the pressure in the evaporation chamber 16, the pressure in the evaporation chamber 16 being adjusted in the second step. It is more desirable that the pressure in the evaporation chamber and the pressure in the film forming chamber be adjusted to be substantially equal to each other. With this, the scattering of the film formation material when canceling the differential pressure structure can be surely suppressed.

The order of the second step and the third step is not limited. The third step may be performed after the second step, or the second step may be performed after the third step. However, it is desirable that the third step be performed after the second step. This is because the film forming chamber can be evacuated up to higher vacuum in the second step, and the consumption amount of nonreactive gas can be suppressed. In a case where the third step is performed after the second step, it is desirable that the third step be started when the film formation material in the evaporation source obtains in the second step the vapor pressure suitable for the film formation.

The introduction of the nonreactive gas to the film forming chamber in the third step may be the introduction through the nonreactive gas introduction mechanism connected to the film forming chamber or may be the introduction through the evaporation chamber. In the case of adopting the latter, the film forming apparatus may be provided with, for example, a pipe connecting the evaporation chamber and the film forming chamber and an on-off valve disposed on the pipe line. In this case, for example, after the gas is introduced to the evaporation chamber in the second step with the on-off valve closed, the on-off valve is opened, so that the gas can be introduced to the film forming chamber in the third step. To prevent the pressure in the evaporation chamber from decreasing by opening the on-off valve, it is preferable that the flow rate of the nonreactive gas introduced to the evaporation chamber be increased while the on-off valve is open. Similarly, in a case where the second step is performed after the third step, the introduction of the nonreactive gas to the evaporation chamber in the second step may be the introduction through the film forming chamber. In these cases, the nonreactive gas introduction mechanism may be connected to one of the evaporation chamber and the film forming chamber.

In the step (d) that is the fourth step, the differential pressure structure achieved by the conductance variable structure in the second step and the third step is canceled. In a case where the differential pressure structure is achieved by a plate-shaped movable dividing wall that is one example of the conductance variable structure, the communication passage between the evaporation chamber and the film forming chamber is enlarged by moving the movable dividing wall. Thus, the differential pressure structure can be canceled. In the fourth step, the differential pressure structure between the evaporation chamber and the film forming chamber is canceled. However, since each of the pressure in the film forming chamber and the pressure in the evaporation chamber is the predetermined pressure or more, the rapid pressure change and the temperature change of the film formation material can be avoided. In the fourth step, as with the second step, the evaporation of the film formation material is suppressed by the pressure of the nonreactive gas although the film formation material has the significant vapor pressure (vapor pressure suitable for the film formation).

In the second step to the fourth step, the conductance variable structure is provided between the opening surface of the evaporation source and the substrate, so that the opening surface and the evaporation source are spaced apart from each other by a certain distance. In the step (e) that is the fifth step after the fourth step, the moving mechanism is activated to cause the evaporation source to move, so that the opening surface of the evaporation source is located close to the substrate. With this, the evaporation source and the substrate are provided at positions suitable for the film formation. In this case, the opening surface and the substrate can be located closer to each other by causing the upper portion of the evaporation source to pass through the communication passage between the evaporation chamber and the film forming chamber (communication passage formed by opening the conductance variable structure).

The movement of the evaporation source is performed such that, for example, the evaporation source provided on a stage connected to the oil-pressure cylinder is moved up by moving up the stage, so that the opening surface formed at the upper portion of the evaporation source is located close to the substrate provided above the evaporation source. By the fifth step, the evaporation source holding the film formation material having the vapor pressure suitable for the film formation can be located close to the substrate, and the preparation for the film formation can be completed. In the fifth step, the pressure in the vacuum chamber is maintained at the predetermined pressure or more, and the evaporation of the film formation material in the evaporation source is being suppressed although the film formation material has the vapor pressure suitable for the film formation.

In the step (f) that is the sixth step after the fifth step, the pressure in the vacuum chamber is decreased to less than the predetermined pressure. With this, the suppression of the evaporation of the film formation material in the evaporation source is canceled, and the film formation on the substrate is started. The pressure decrease in the vacuum chamber can be achieved by decreasing the amount of reactant gas introduced to the film forming chamber and the evaporation chamber or increasing an evacuating rate of the vacuum pump. Although the evaporation of the film formation material has been suppressed by the pressure of the nonreactive gas, the film formation material starts evaporating when the pressure in the vacuum chamber is decreased to less than the vapor pressure of the film formation material. With this, the film formation on the substrate can be started.

Figure 2:
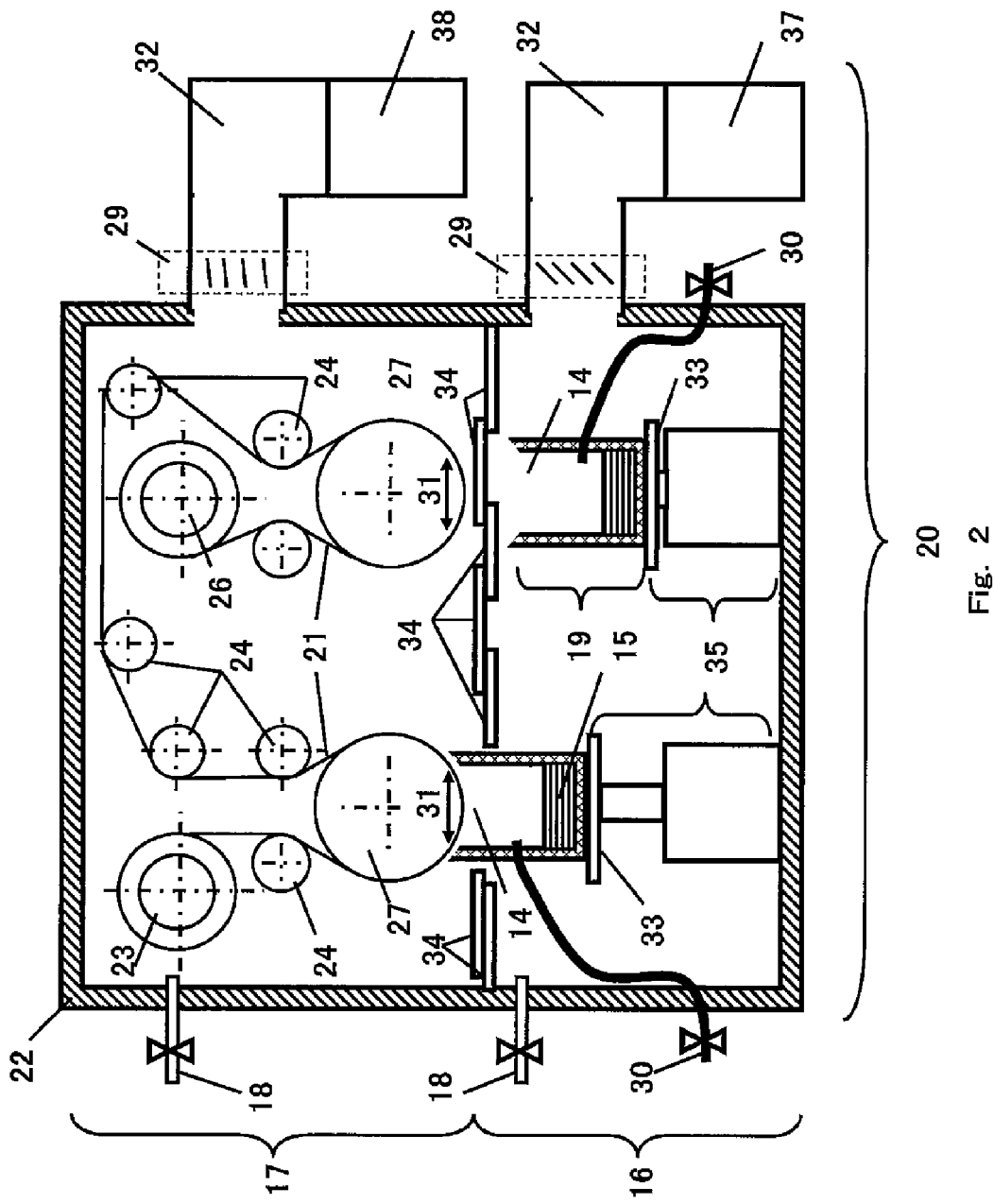
FIG. 2 is a diagram schematically showing another example of the device used in the thin film manufacturing method of the present invention.

The thin film manufacturing method of the present invention is also applicable to a take-up type film forming apparatus. The entire configuration of the take-up type film forming apparatus is schematically shown in FIG. 2. Explanations of the same components as in FIG. 1 are omitted. A core roller A23, a plurality of feed rollers 24, cans 27, and a core roller B26 are accommodated in an internal space of the film forming chamber 17. The evaporation sources 19, the moving mechanisms 35, and film formation reaction gas introduction tubes 30 are accommodated in an internal space of the evaporation chamber 16. The core roller A23 is a roller-like member provided so as to be rotatable about a shaft center thereof. The substrate 21 having an elongated band shape winds around the surface of the core roller A23. The core roller A23 supplies the substrate 21 toward the feed roller 24 located closest to the core roller A23.

Examples of the substrate 21 are various polymer films, various metal foils, a complex of the polymer film and the metal foil, and elongated substrates made of materials other than the above materials. Examples of the polymer film are polyethylene terephthalate, polyethylene naphthalate, polyamide, and polyimide. Examples of the metal foil are aluminum foils, copper foils, nickel foils, titanium foils, and stainless steel foils. For example, the width of the substrate is 50 to 1,000 mm, and a desirable thickness of the substrate is 3 to 150 µm. The productivity deteriorates when the width of the substrate is less than 50 mm. However, this does not mean that the present invention is inapplicable. When the thickness of the substrate is less than 3 µm, the heat capacity of the substrate is extremely small, so that the heat deformation of the substrate easily occurs. However, this does not mean that the present invention is inapplicable. A feed rate of the substrate during the film formation differs depending on the type of the thin film to be formed and conditions for the film formation, but is set to, for example, 0.1 to 500 m/min. A tension applied in the traveling direction of the substrate being fed is suitably selected depending on the material and thickness of the substrate and process conditions, such as a film formation rate.

Each of the feed rollers 24 is a roller-like member provided so as to be rotatable about a shaft center thereof. The feed rollers 24 guide the substrate 21, fed from the core roller A23, to a film forming region 31 to finally guide the substrate 21 to the core roller B26. While the substrate 21 travels the film forming region 31 along the can 27, material particles from the evaporation source are deposited to form a thin film on the surface of the substrate 21. The core roller B26 is a roller-like member provided so as to be rotatable by a driving unit, not shown. The core roller B26 takes up and holds the substrate 21 on which the thin film is formed.

The film forming apparatus used for the thin film manufacturing method of the present invention may further include a unit configured to introduce a film formation gas for reaction film formation. One example of such film formation gas introducing unit is the film formation reaction gas introduction tube 30 shown in FIGS. 1A, 1B, and 2. The film formation reaction gas introduction tube 30 is, for example, a tubular member, one end of which is guided to an inner portion of the evaporation source 19 and the other end of which is connected to a film formation reaction gas supply unit, not shown, provided outside the vacuum chamber 22. The film formation gas, such as oxygen or nitrogen, is supplied through the film formation reaction gas introduction tube 30 to the vapor of the film formation material. With this, the thin film, which contains, as a major component, oxide, nitride, or oxynitride of the film formation material from the evaporation source, is formed on the surface of the substrate 21. Examples of the film formation reaction gas supply unit are a gas bomb and a gas generator.

In the film forming region 31, the substrate 21 receives the vapor from the evaporation source and, according to need, the film formation gas, such as oxygen or nitrogen. Thus, the thin film is formed on the surface of the substrate 21. The substrate 21 on which the thin film is formed is taken up by the core roller B26 through the other feed rollers 24.

As above, according to the film forming apparatus 20 of FIG. 2, the substrate 21 from the core roller A23 travels through the feed rollers 24 to be taken up by the core roller B26. In the middle of this process, in the film forming region 31, the substrate receives the vapor from evaporation source and, according to need, the film formation gas, such as oxygen or nitrogen. Thus, the thin film is formed on the substrate. By these operations, the film forming apparatus 20 can perform the take-up film formation by using the nozzle-type evaporation source 19.

In the film forming apparatus 20 of FIG. 2, two cans 27 and two evaporation sources 19 are provided, and an inverted structure is provided between the two cans. With this, the thin film can be formed on each of the front surface and rear surface of the substrate. However, the take-up type film forming apparatus usable in the present invention is not limited to this. An apparatus including one can 27 and one evaporation source 19 and configured to form the thin film only on one surface of the substrate may be used.

Embodiment 1

One example of embodiments of the thin film manufacturing method of the present invention will be explained. In this embodiment, a lithium film is formed on a lithium ion secondary battery negative electrode made from a silicon thin film. Respective numerical values explained below are just examples and do not limit the present invention.

A roughened copper foil (18 microns in thickness, 100 mm in width) produced by Furukawa Circuit Foil Co., Ltd. is used as a current collector. Used as the substrate of the present invention is a substrate formed such that a silicon multi-layer thin film having a thickness of 8 μm is formed on each of both surfaces of the current collector by vacuum deposition.

First, the silicon multi-layer thin film is formed by using a take-up type deposition apparatus (not shown) in accordance with the following procedure. The pressure in a vacuum chamber having a volume of 0.4 cubic meter and including as exhaust units two oil diffusion pumps each having a bore of 14 inches is decreased up to 0.002 Pascal. Then, silicon that is the film formation material is melted. The silicon is melted by a 270-degree deflection electron beam evaporation source produced by JEOL Ltd. The melted silicon is irradiated with an electron beam having an accelerating voltage of −10 kV and an emission current of 600 mA, and the generated vapor is supplied to the copper foil which is traveling along the can. The feed rate of the current collector is 1 m/min, and an average film formation rate is 80 nm/sec.

A metal mask (the length of each of openings is 100 mm) is provided so as to be spaced apart from the copper foil current collector by about 2 mm such that the width of the silicon thin film formed becomes 85 mm. A copper foil current collector feed mechanism can perform round trips of the current collector. By one-time traveling, one-layer silicon thin films each having a thickness of about 0.5 micron are formed on both surfaces of the current collector. By performing the film formation 16 times while making the round trips, the silicon multi-layer thin films each having a thickness of about 8 microns are formed.

Figure 5:
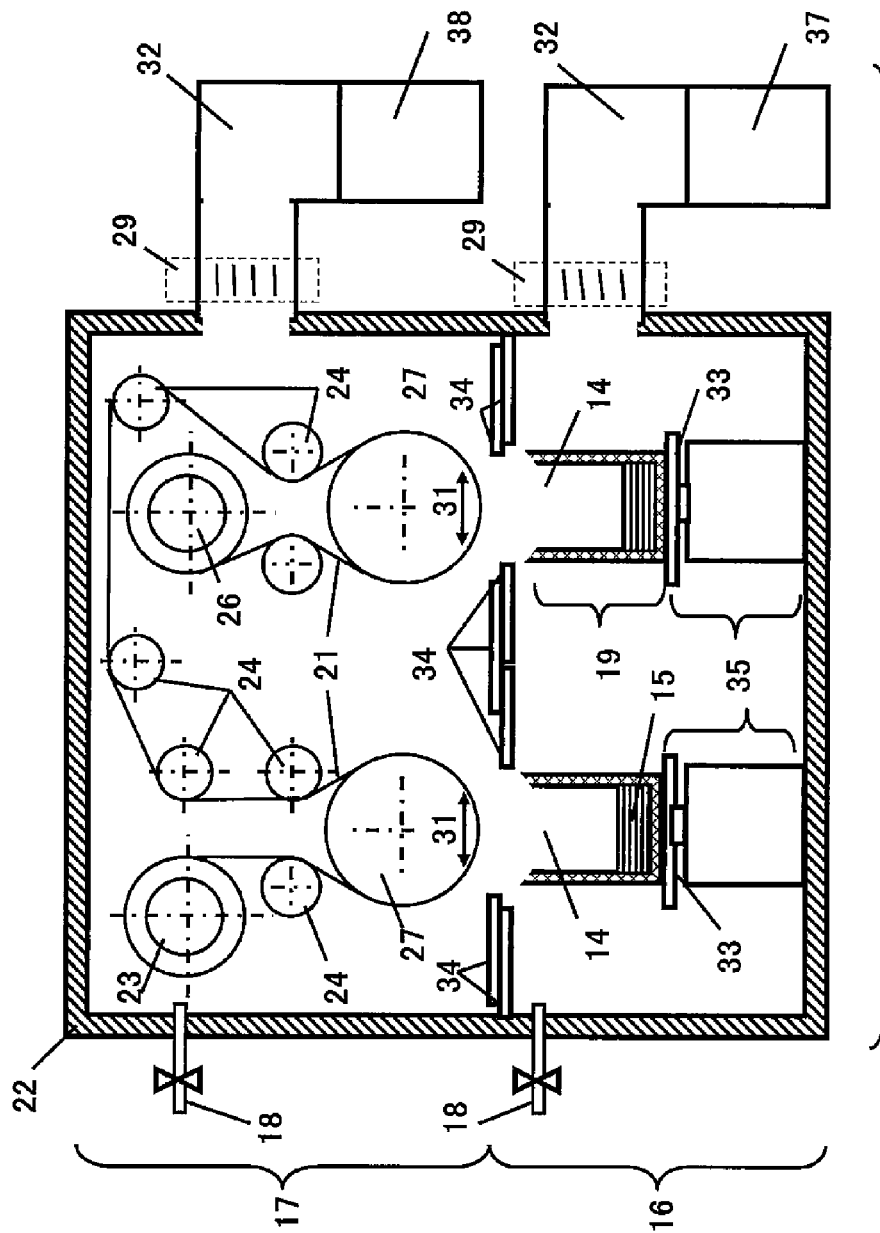
FIG. 5(1) is a diagram schematically showing Embodiment 1 (first step) of the thin film manufacturing method of the present invention.
Figure 5:
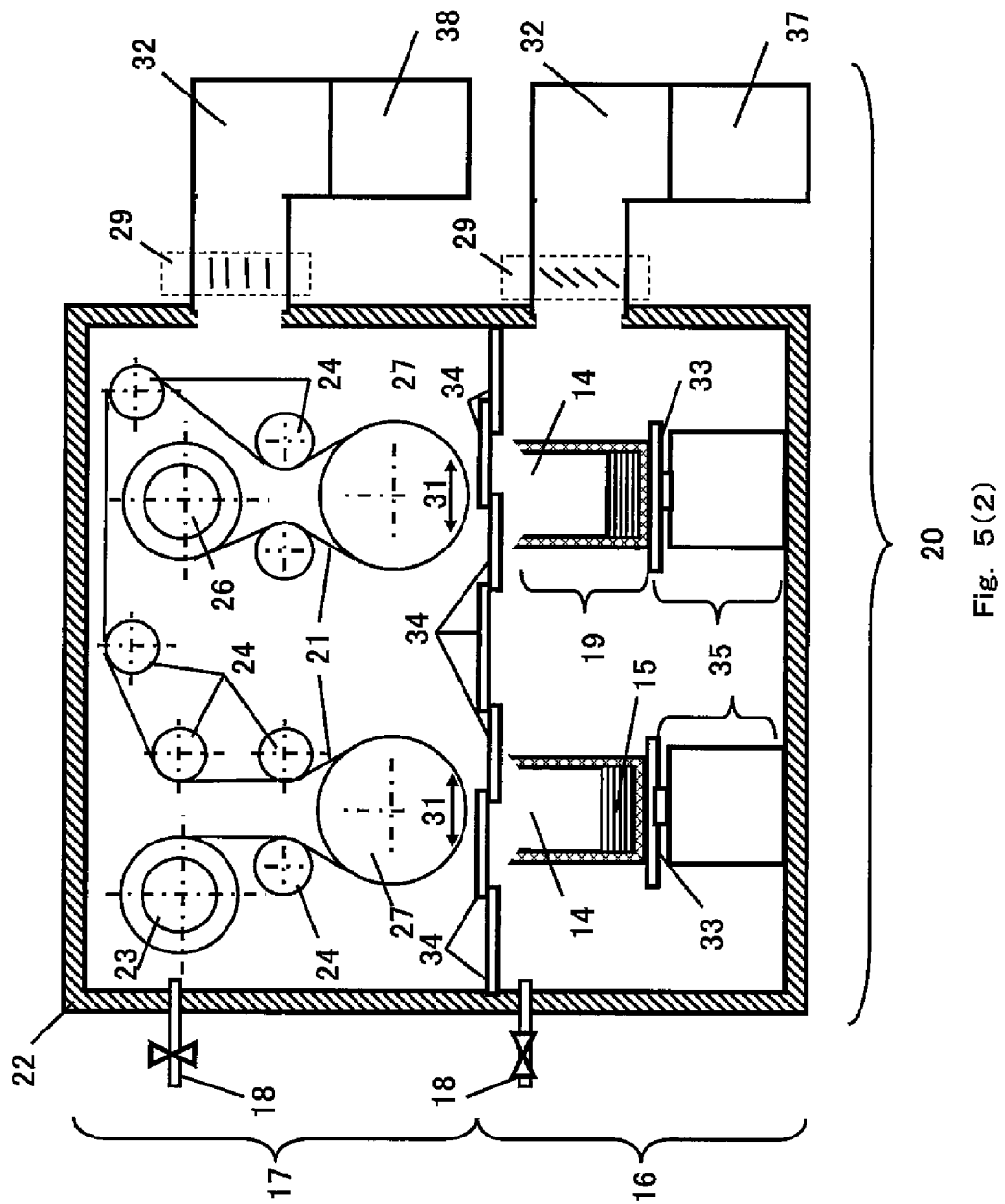
Figure 5:
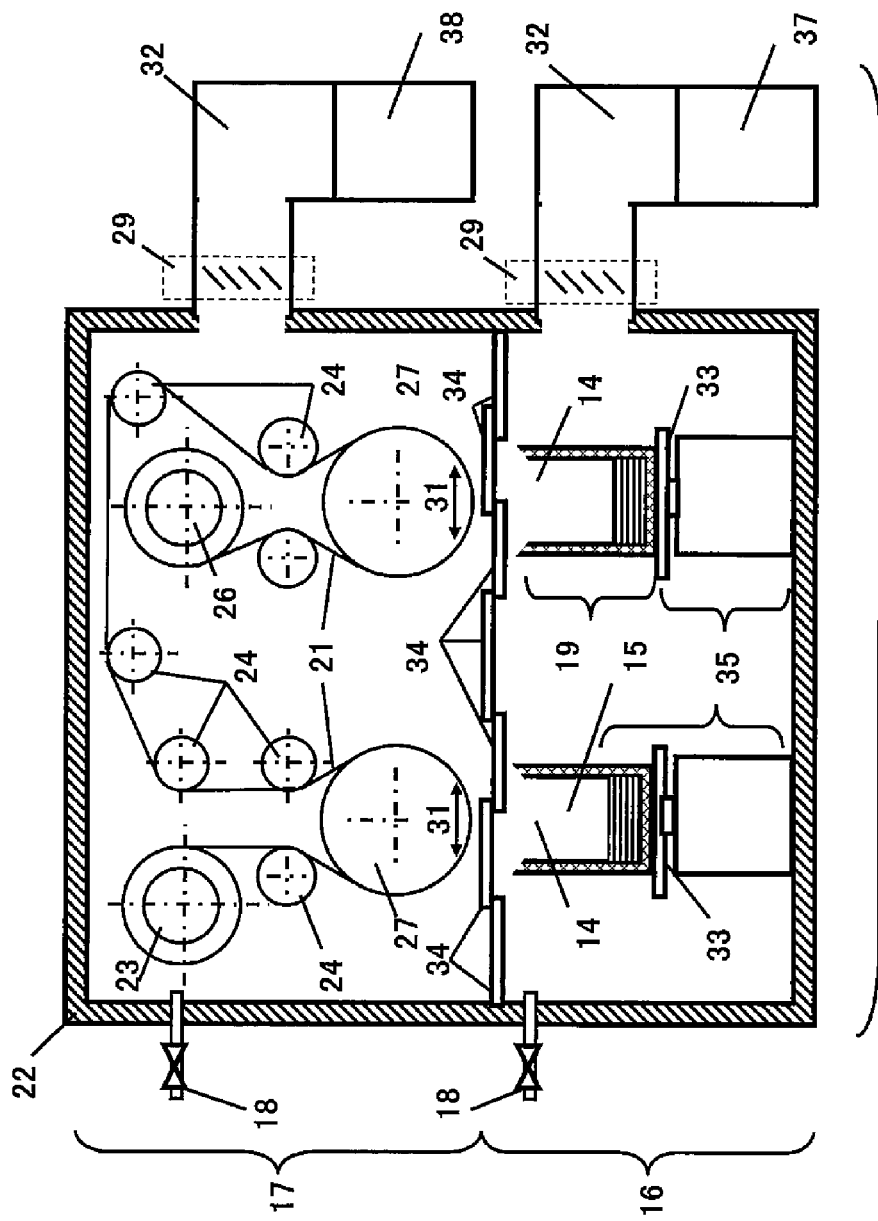
Figure 5:
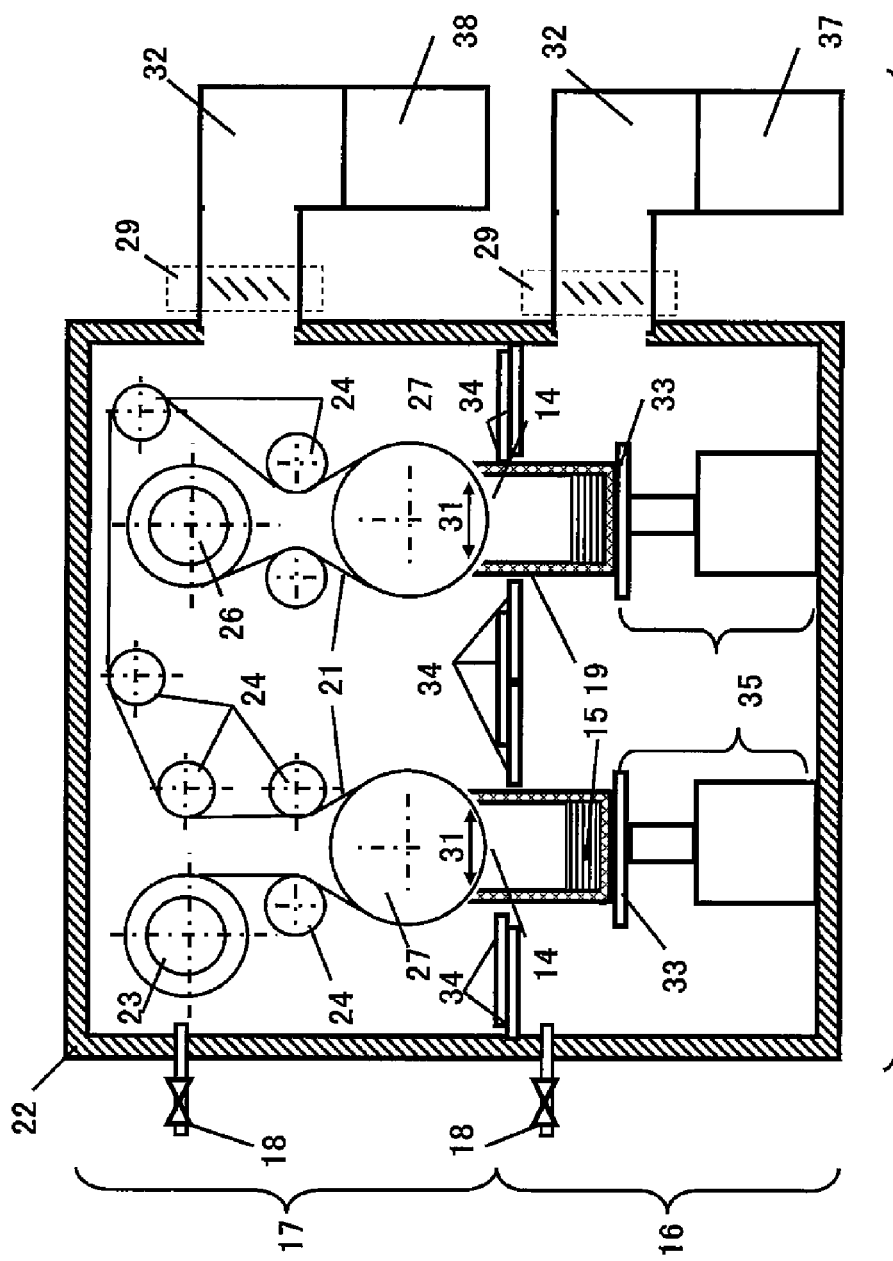
Figure 5:
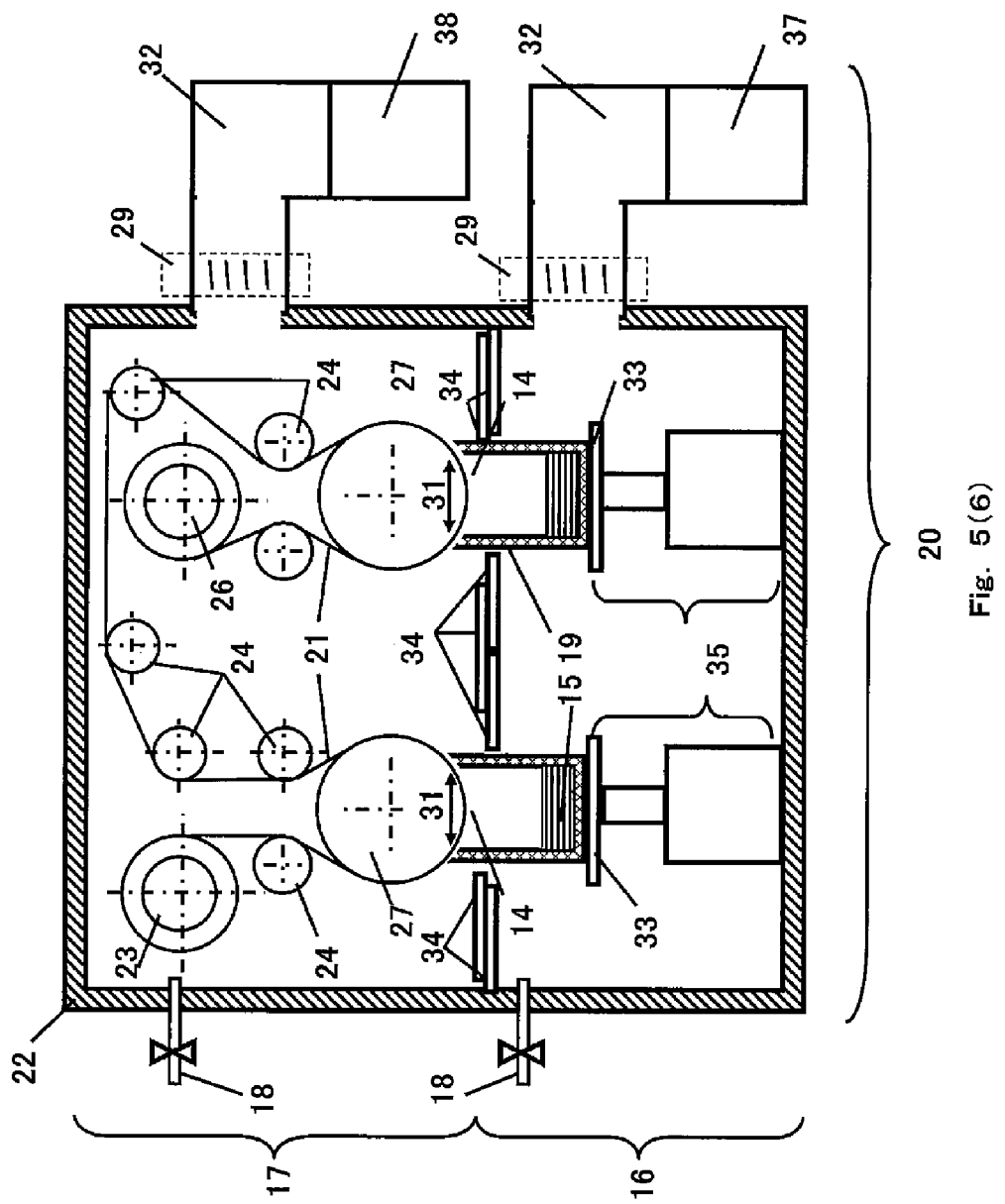

Next, the current collector on which the silicon thin films are formed is used as the substrate, and the lithium films are respectively formed on both surfaces of the substrate by the thin film manufacturing method of the present invention. FIGS. 5(1) to 5(6) are diagrams showing steps of Embodiment 1. In FIGS. 5(1) to 5(6), the same reference signs are used for the same components as in FIG. 2, and explanations thereof are omitted. The melting point of the lithium is 180° C.

First Step

As shown in FIG. 5(1), the substrate 21 on which the silicon thin films are formed in advance is attached to the core roller A23. The substrate 21 is provided along a feed route extending from the core roller A23 through the feed rollers 24 and the cans 27 to the core roller B26. After vacuum rough pumping, the evaporation chamber and the film forming chamber are evacuated up to the high vacuum by the 14-inch oil diffusion pumps 37 and 38. At this time, the conductance variable structure 34 realizes a communication state (cancellation of the differential pressure structure) where the conductance between the evaporation chamber 16 and the film forming chamber 17 is maximum. The opening surface 14 is formed at the upper portion of the evaporation source 19. The opening surface is curved so as to conform to the shape of the can such that the opening surface can be located close to the substrate on the can. The evaporation source is a nozzle-type evaporation source including a stainless steel wall surface and a heat source. 20 g of metal lithium is accommodated in the internal space of the evaporation source. The evaporation source is lowered by using the moving mechanism so as to be located at a position farthest from the substrate. In this state, the evaporation chamber and the film forming chamber are evacuated for about 30 minutes. Thus, the pressure in each chamber is adjusted to 0.005 Pa.

Second Step

When the pressure in the evaporation chamber reaches 0.005 Pa in the first step, as shown in FIG. 5(2), the conductance variable structure is activated to substantially shut off the communication between the evaporation chamber 16 and the film forming chamber 17 such that the conductance between these chambers becomes minimum. In this state, the evaporation chamber and the film forming chamber are continuously evacuated, and the argon (nonreactive gas) is introduced to the evaporation chamber at 50 sccm. With this, the pressure in the evaporation chamber is adjusted to about 0.05 Pa. A target temperature is set to 480° C., and the heating of the nozzle-type evaporation source is started. When the temperature of the evaporation source reaches 300° C., the amount of argon introduced to the evaporation chamber is increased to 100 sccm. In addition, the conductance valve 29 between the evaporation chamber and the main valve is set to a semiclosed state. Thus, the pressure in the evaporation chamber is increased up to 0.2 Pa while preventing the load applied to the main pump from becoming excessively high. By the pressure in the evaporation chamber, the evaporation of the lithium which melts by heating and starts obtaining the vapor pressure is suppressed.

Third Step

As shown in FIG. 5(3), while maintaining the state of the conductance variable structure, the introduction of the argon to the film forming chamber is started when the temperature of the evaporation source stabilizes at 480° C. that is the target temperature. The argon is introduced to the film forming chamber at 100 sccm. The opening degree of the conductance valve between the film forming chamber and the main valve is adjusted, and the pressure in the film forming chamber is increased up to 0.2 Pa.

Fourth Step

As shown in FIG. 5(4), the movable dividing wall of the conductance variable structure is moved to realize a communication state where the conductance between the evaporation chamber and the film forming chamber becomes maximum. The pressure in each of the film forming chamber and the evaporation chamber is maintained at 0.2 Pa.

Fifth Step

While maintaining the pressure in each of the film forming chamber and the evaporation chamber, as shown in FIG. 5(5), the position of the evaporation source is moved up by the moving mechanism, so that the opening surface of the evaporation source is located close to the substrate. With this, the distance between the can and the opening surface of the evaporation source is set to about 3 mm. In addition, a take-up travel of the substrate is started at a rate of 2 m/min.

Sixth Step

As shown in FIG. 5(6), the conductance valves for the evaporation chamber and the film forming chamber are fully opened, and the introduction of the nonreactive gas is stopped. With this, the pressure in each of the evaporation chamber and the film forming chamber is decreased up to 0.005 Pa. With this, the suppression of the evaporation of the lithium is canceled. The lithium evaporates to adhere to the substrate, and the lithium film having a thickness of about 1.5 microns is formed on the substrate. The lithium film reacts with and is absorbed in the silicon thin film immediately after the film formation.

Embodiment 2

Another example of the embodiments of the thin film manufacturing method of the present invention will be explained. In this embodiment, the lithium film is formed on the lithium ion secondary battery negative electrode made from the silicon oxide thin film. Respective numerical values explained below are just examples and do not limit the present invention.

A roughened copper foil (18 microns in thickness, 100 mm in width) produced by Furukawa Circuit Foil Co., Ltd. is used as a current collector. Used as the substrate of the present invention is a substrate formed such that a silicon oxide multi-layer thin film having a thickness of 15 μm is formed on each of both surfaces of the current collector by vacuum deposition.

First, the silicon oxide multi-layer thin film is formed by using a take-up type deposition apparatus (not shown) in accordance with the following procedure. The pressure in a vacuum chamber having a volume of 0.4 cubic meter and including as exhaust units two oil diffusion pumps each having a bore of 14 inches is decreased up to 0.002 Pascal. Then, silicon that is the film formation material is melted. The silicon is melted by a 270-degree deflection electron beam evaporation source produced by JEOL Ltd. The melted silicon is irradiated with an electron beam having an accelerating voltage of −10 kV and an emission current of 950 mA, and the generated vapor is supplied to the copper foil which is traveling along the can. The feed rate of the current collector is 1 m/min, and the average film formation rate is 160 nm/sec.

A metal mask (the length of each of openings is 100 mm) is provided so as to be spaced apart from the copper foil substrate by about 2 mm such that the width of the silicon thin film formed becomes 85 mm. In addition, an oxygen gas is supplied at 60 sccm toward the openings of the metal mask from a reactant gas nozzle provided on a film formation surface side of the copper foil current collector. With this, the silicon oxide thin films are formed on the copper foil substrate. The copper foil current collector feed mechanism can perform round trips of the current collector. By one-time traveling, one-layer silicon thin films each having a thickness of about 1 micron are formed on both surfaces of the current collector. By performing the film formation 15 times while making the round trips, the silicon oxide multi-layer thin films each having a thickness of about 15 microns are formed.

Next, the current collector on which the silicon oxide thin films are formed is used as the substrate, and the lithium films are formed on both surfaces of the substrate by the thin film manufacturing method of the present invention. FIGS. 6(1) to 6(6) are diagrams showing steps of Embodiment 2. In FIGS. 6(1) to 6(6), the same reference signs are used for the same components as in FIG. 2, and explanations thereof are omitted. In FIGS. 6(1) to 6(6), the film forming chamber and the evaporation chamber are provided next to each other along a horizontal direction, and the evaporation source 19 has the opening surface on the side surface thereof. The moving mechanism causes the evaporation source 19 to move in the horizontal direction.

First Step

As shown in FIG. 6(1), the substrate 21 on which the silicon oxide thin films are formed in advance is attached to the core roller A23. The substrate 21 is provided along a feed route extending from the core roller A23 through the feed rollers 24 and the cans 27 to the core roller B26. After vacuum rough pumping, the evaporation chamber and the film forming chamber are evacuated up to the high vacuum by the 14-inch oil diffusion pumps 37 and 38. At this time, the conductance variable structure 34 realizes a substantially shutoff state (differential pressure structure) where the conductance between the evaporation chamber 16 and the film forming chamber 17 is minimum. The opening surface 14 is formed at the upper portion of the evaporation source 19. The opening surface is curved so as to conform to the shape of the can such that the opening surface can be located close to the substrate on the can. The evaporation source is a nozzle-type evaporation source including a stainless steel wall surface and a heat source. 20 g of metal lithium is accommodated in the internal space of the evaporation source. The evaporation source is moved to the right in FIGS. 6(1) to 6(6) by using the moving mechanism so as to be located at a position farthest from the substrate. In this state, the evaporation chamber and the film forming chamber are evacuated for about 30 minutes. Thus, the pressure in each chamber is adjusted to 0.005 Pa.

Second Step

When the pressure in the evaporation chamber reaches 0.005 Pa in the first step, as shown in FIG. 6(2), the differential pressure structure is maintained, and the evaporation chamber and the film forming chamber are continuously evacuated. In addition, the argon (nonreactive gas) is introduced to the evaporation chamber at 50 sccm. With this, the pressure in the evaporation chamber is adjusted to about 0.05 Pa. A target temperature is set to 500° C., and the heating of the nozzle-type evaporation source is started. When the temperature of the evaporation source reaches 300° C., the amount of argon introduced to the evaporation chamber is increased to 100 sccm. In addition, the conductance valve 29 between the evaporation chamber and the main valve is set to a semiclosed state. Thus, the pressure in the evaporation chamber is increased up to 0.2 Pa while preventing the load applied to the main pump from becoming excessively high. Further, when the temperature of the evaporation source reaches 450° C., the amount of argon introduced to the evaporation chamber is further increased to 150 sccm. In addition, the conductance valve 29 between the evaporation chamber and the main valve is adjusted to increase the pressure in the evaporation chamber up to 0.4 Pa. By the pressure in the evaporation chamber, the evaporation of the lithium which melts by heating and starts obtaining the vapor pressure is suppressed.

Third Step

As shown in FIG. 6(3), while maintaining the state of the conductance variable structure, the introduction of the argon to the film forming chamber is started when the temperature of the evaporation source stabilizes at 500° C. that is the target temperature. The argon is introduced to the film forming chamber at 150 sccm. The opening degree of the conductance valve between the film forming chamber and the main valve is adjusted, and the pressure in the film forming chamber is increased up to 0.4 Pa.

Fourth Step

As shown in FIG. 6(4), the movable dividing wall of the conductance variable structure is moved to realize a communication state where the conductance between the evaporation chamber and the film forming chamber becomes maximum. The pressure in each of the film forming chamber and the evaporation chamber is maintained at 0.4 Pa.

Fifth Step

While maintaining the pressure in each of the film forming chamber and the evaporation chamber, as shown in FIG. 6(5), the evaporation source is moved to the left by the moving mechanism, so that the opening surface of the evaporation source is located close to the substrate. With this, the distance between the can and the opening surface of the evaporation source is set to about 3 mm. In addition, a take-up travel of the substrate is started at a rate of 1 m/min.

Sixth Step

As shown in FIG. 6(6), the conductance valves for the evaporation chamber and the film forming chamber are fully opened, and the introduction of the nonreactive gas is stopped. With this, the pressure in each of the evaporation chamber and the film forming chamber is decreased up to 0.005 Pa. With this, the suppression of the evaporation of the lithium is canceled. The lithium evaporates to adhere to the substrate, and the lithium film having a thickness of about 6 microns is formed on the substrate. The lithium film reacts with and is absorbed in the silicon oxide thin film immediately after the film formation.

The foregoing has specifically explained the embodiments of the present invention. However, the present invention is not limited to these embodiments. Various materials other than lithium can be used as the film formation material, and examples are various metals and organic materials which can be heated and evaporated. In this case, a constituent material of the evaporation source may be suitably selected such that the film formation material and the constituent material of the evaporation source do not melt or do not react with each other, such as do not alloy, at a temperature at which desired vapor pressure is achieved.

As a specific application example, the foregoing has explained a case where the lithium ion secondary battery negative electrode is formed. However, the present invention is not limited to this. According to the present invention, for example, a polar plate for an electrochemical capacitor may be formed. The present invention is applicable to various fields, such as organic thin films, decoration films, solar batteries, gas barrier films, various sensors, and various optical films, which require highly-efficient, stable film formation. Further, the present invention is applicable to the thin film manufacturing method used when producing various devices.

INDUSTRIAL APPLICABILITY

According to the thin film manufacturing method of the present invention, in the film formation using the nozzle-type evaporation source, the evacuation time necessary before the film formation can be shortened, the film quality can be increased, the material use efficiency can be improved, and the contamination of the vacuum chamber by the material scattering can be prevented. In addition, since the thin film manufacturing method of the present invention can be combined with various substrate feed systems, the thin film manufacturing method which achieves highly-efficient, stable film formation can be realized.

REFERENCE SIGNS LIST 14 opening surface
15 film formation material
16 evaporation chamber
17 film forming chamber
18 nonreactive gas introduction mechanism
19 evaporation source
20 film forming apparatus
21 substrate
22 vacuum chamber
23 core roller A
24 feed roller
26 core roller B
27 can
29 conductance valve
30 film formation reaction gas introduction tube
31 film forming region
32 main valve
33 stage
34 conductance variable structure
35 moving mechanism
37 vacuum pump
38 vacuum pump

The invention claimed is:

1. A method of manufacturing a thin film in a film forming apparatus,
the film forming apparatus comprising:
an evaporation chamber;
a film forming chamber which is provided adjacent to the evaporation chamber and in which a substrate is provided;
vacuum pumps respectively connected to the evaporation chamber and the film forming chamber;
a nonreactive gas introduction mechanism connected to one or both of the evaporation chamber and the film forming chamber;
an evaporation source provided in the evaporation chamber, holding a film formation material, and having a semi-sealed structure including an opening face;
a moving mechanism configured to cause the evaporation source to move such that the opening face is able to be located close to the substrate; and
a conductance variable structure provided between the evaporation chamber and the film forming chamber,
the method comprising:
a first step of evacuating the film forming chamber and the evaporation chamber;
after the first step, a second step of suppressing evaporation of the film formation material by introducing a nonreactive gas to the evaporation chamber to adjust pressure in the evaporation chamber to predetermined pressure or more in a state where differential pressure between the evaporation chamber and the film forming chamber is able to be secured by the conductance variable structure;

after the first step, a third step of introducing the nonreactive gas to the film forming chamber to adjust the pressure in the film forming chamber to the predetermined pressure or more in a state where the differential pressure between the evaporation chamber and the film forming chamber is able to be secured by the conductance variable structure;

after the second step and the third step, a fourth step of activating the conductance variable structure to cancel the state where the differential pressure between the evaporation chamber and the film forming chamber is able to be secured;

after the fourth step, a fifth step of causing the evaporation source to move by the moving mechanism such that the opening face passes through the conductance variable structure that has cancelled the state where the differential pressure between the evaporation chamber and the film forming chamber is able to be secured and is located close to the substrate; and after the fifth step, a sixth step of canceling suppression of the evaporation of the film formation material and starting film formation on the substrate by decreasing the pressure in each of the film forming chamber and the evaporation chamber to less than the predetermined pressure, wherein during the fourth and fifth steps, each of the pressure in the film forming chamber and the pressure in the evaporation chamber is maintained at the predetermined pressure or more, and wherein when the conductance variable structure is activated to cancel the state where the differential pressure between the evaporation chamber and the film forming chamber is able to be secured, the opening face of the evaporation source faces the substrate.

2. The method according to claim 1, wherein in the second step, the nonreactive gas is introduced to the evaporation chamber while heating the film formation material in the evaporation source.

3. The method according to claim 1, wherein the predetermined pressure is twice or more as high as the vapor pressure of the film formation material.

4. The method according to claim 2, wherein in the second step, when heating the film formation material in the evaporation source, an amount of the nonreactive gas introduced to the evaporation chamber is increased in accordance with temperature increase of the film formation material.

5. The method according to claim 1, wherein the second step and the third step are performed while evacuating the film forming chamber and the evaporation chamber at an evacuating rate lower than an evacuating rate in the first step.

6. The method according to claim 1, wherein a pressure in the film forming chamber in the third step is substantially equal to or larger than a pressure in the evaporation chamber in the second step.

7. The method according to claim 1, wherein, in the fourth step, the film forming chamber and the evaporation chamber are kept at the predetermined pressure or more by the nonreactive gas.

* * * * *